(12) United States Patent
Takebayashi et al.

(10) Patent No.: US 12,188,124 B2
(45) Date of Patent: Jan. 7, 2025

(54) SUBSTRATE PROCESSING APPARATUS, GAS NOZZLE AND METHOD OF MANUFACTURING SEMICONDUCTOR DEVICE

(71) Applicant: Kokusai Electric Corporation, Tokyo (JP)

(72) Inventors: Yuji Takebayashi, Toyama (JP); Unryu Ogawa, Toyama (JP); Toshiki Fujino, Toyama (JP); Yukihito Hada, Toyama (JP); Naoko Tsunoda, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 1061 days.

(21) Appl. No.: 17/009,218

(22) Filed: Sep. 1, 2020

(65) Prior Publication Data

US 2020/0392625 A1 Dec. 17, 2020

Related U.S. Application Data

(63) Continuation of application No. PCT/JP2019/008379, filed on Mar. 4, 2019.

(30) Foreign Application Priority Data

Mar. 28, 2018 (JP) .................................. 2018-063255

(51) Int. Cl.
*C23C 16/455* (2006.01)
*C23C 16/458* (2006.01)
(Continued)

(52) U.S. Cl.
CPC .... *C23C 16/45565* (2013.01); *C23C 16/4587* (2013.01); *C23C 16/483* (2013.01);
(Continued)

(58) Field of Classification Search
CPC .......... C23C 16/45565; C23C 16/4587; C23C 16/483; C23C 16/52; C23C 16/403;
(Continued)

(56) References Cited

U.S. PATENT DOCUMENTS 9,587,313 B2    3/2017  Wada et al.
2008/0092821 A1*  4/2008  Otsuka .............. H01L 21/68757
                                                        118/728
(Continued)

FOREIGN PATENT DOCUMENTS

CN  101418465 A  *  4/2009  ......... C23C 16/4488
JP  61-199629 A     9/1986
(Continued)

OTHER PUBLICATIONS

Office Action in corresponding Japanese Patent Application No. 2020-509752, drafted on Oct. 8, 2021, with English translation.
(Continued)

*Primary Examiner* — Jeffrie R Lund
(74) *Attorney, Agent, or Firm* — Edell, Shapiro & Finnan, LLC

(57) ABSTRACT

Described herein is a technique capable of suppressing or preventing an inside of a source gas nozzle from being heated to a substrate processing temperature when a source gas is supplied through the source gas nozzle into a reaction tube in which a substrate is accommodated. According to one aspect of the technique, there is provided a substrate processing apparatus including: a reaction tube made of a first material and capable of accommodating a substrate; and a source gas nozzle provided in the reaction tube and at least a part thereof made of a second material whose reflectance is higher than that of the first material and whose surface is
(Continued)

rougher than that of the first material by bubbles contained therein, wherein a source gas is supplied through the source gas nozzle.

17 Claims, 9 Drawing Sheets

(51) Int. Cl.
  *C23C 16/48* (2006.01)
  *C23C 16/52* (2006.01)
  *H01L 21/02* (2006.01)
  *H01L 21/67* (2006.01)

(52) U.S. Cl.
  CPC ........ *C23C 16/52* (2013.01); *H01L 21/02181* (2013.01); *H01L 21/67017* (2013.01)

(58) Field of Classification Search
  CPC .......... C23C 16/45546; C23C 16/4557; C23C 16/45578; C23C 16/46; C23C 16/45523; C23C 16/4584; C23C 16/481; H01L 21/02181; H01L 21/67017; H01L 21/67109; H01L 21/67115
  See application file for complete search history.

(56) References Cited

U.S. PATENT DOCUMENTS

| | | | |
|---|---|---|---|
| 2010/0212593 A1* | 8/2010 | Takebayashi | H01L 21/67109 118/725 |
| 2013/0247817 A1 | 9/2013 | Konno et al. | |
| 2015/0132972 A1 | 5/2015 | Wada et al. | |
| 2020/0392625 A1* | 12/2020 | Takebayashi | C23C 16/46 |

FOREIGN PATENT DOCUMENTS

| | | | | |
|---|---|---|---|---|
| JP | S6457634 U | * | 10/1989 | |
| JP | 07-86178 A | | 3/1995 | |
| JP | 07-147248 A | | 6/1995 | |
| JP | 07111958 B2 | | 11/1995 | |
| JP | 08-119650 A | | 5/1996 | |
| JP | 2005-79481 A | | 3/2005 | |
| JP | 2013-225648 A | | 10/2013 | |
| JP | 2016018907 A | * | 2/2016 | ............. C23C 16/30 |
| JP | 2018-056300 A | | 4/2018 | |
| KR | 940009995 B1 | * | 10/1994 | |
| KR | 101715530 B1 | | 3/2017 | |

OTHER PUBLICATIONS

Office Action in corresponding Korean Patent Application No. 10-2020-7024784, dated May 4, 2022, with English translation.

* cited by examiner

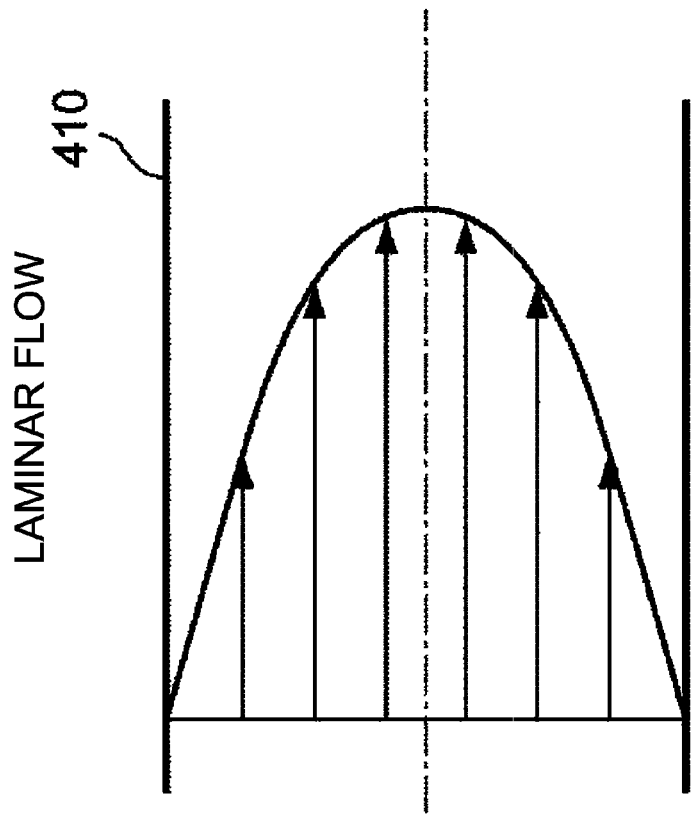
FIG. 4A  LAMINAR FLOW
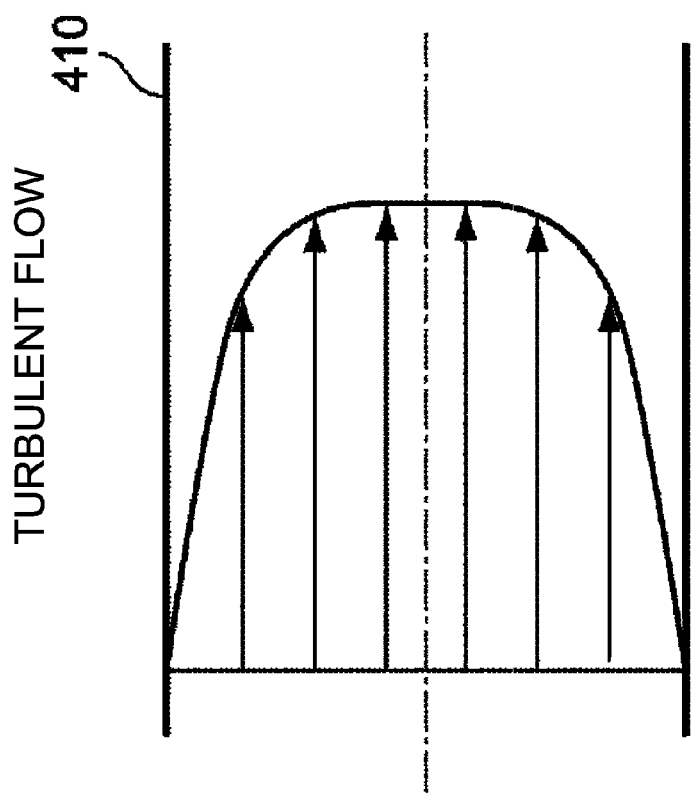
FIG. 4B  TURBULENT FLOW

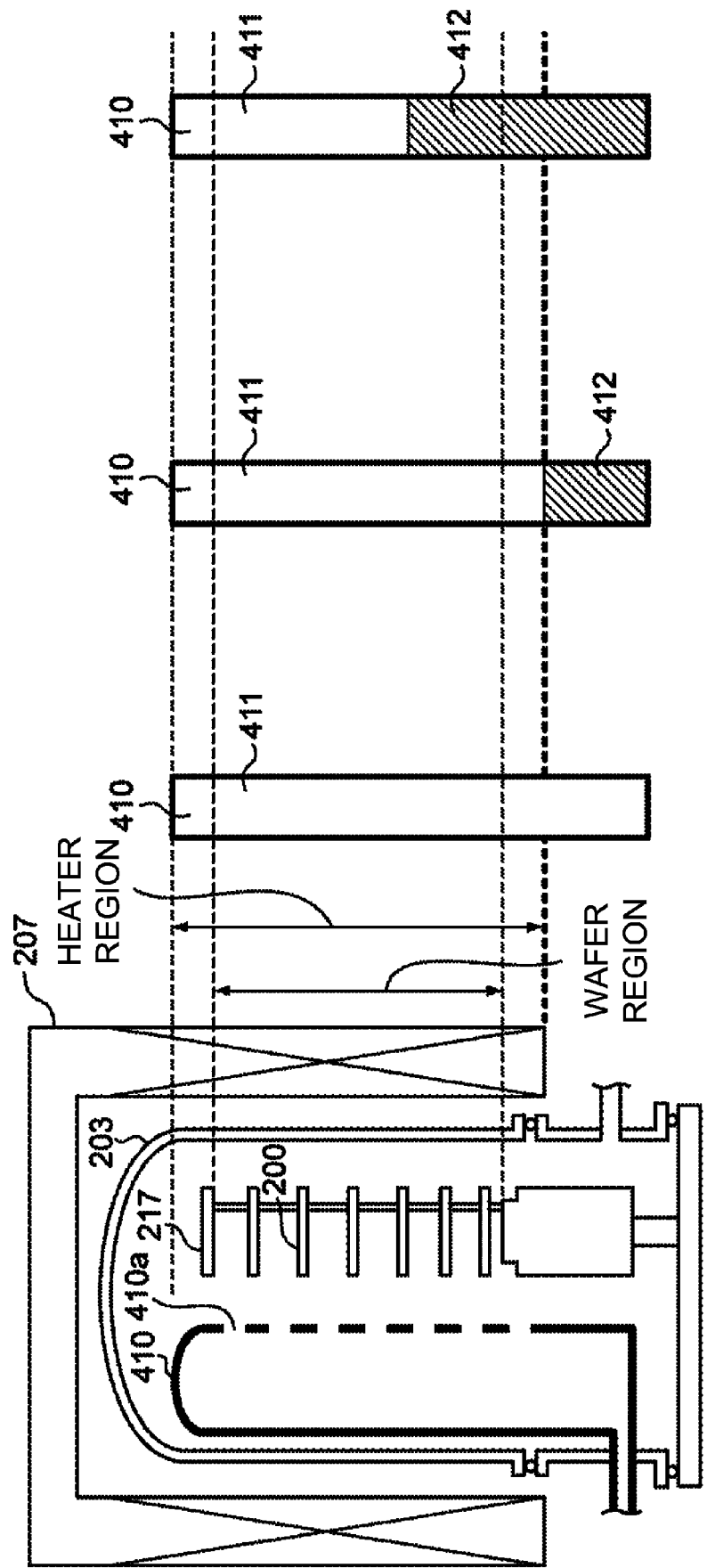

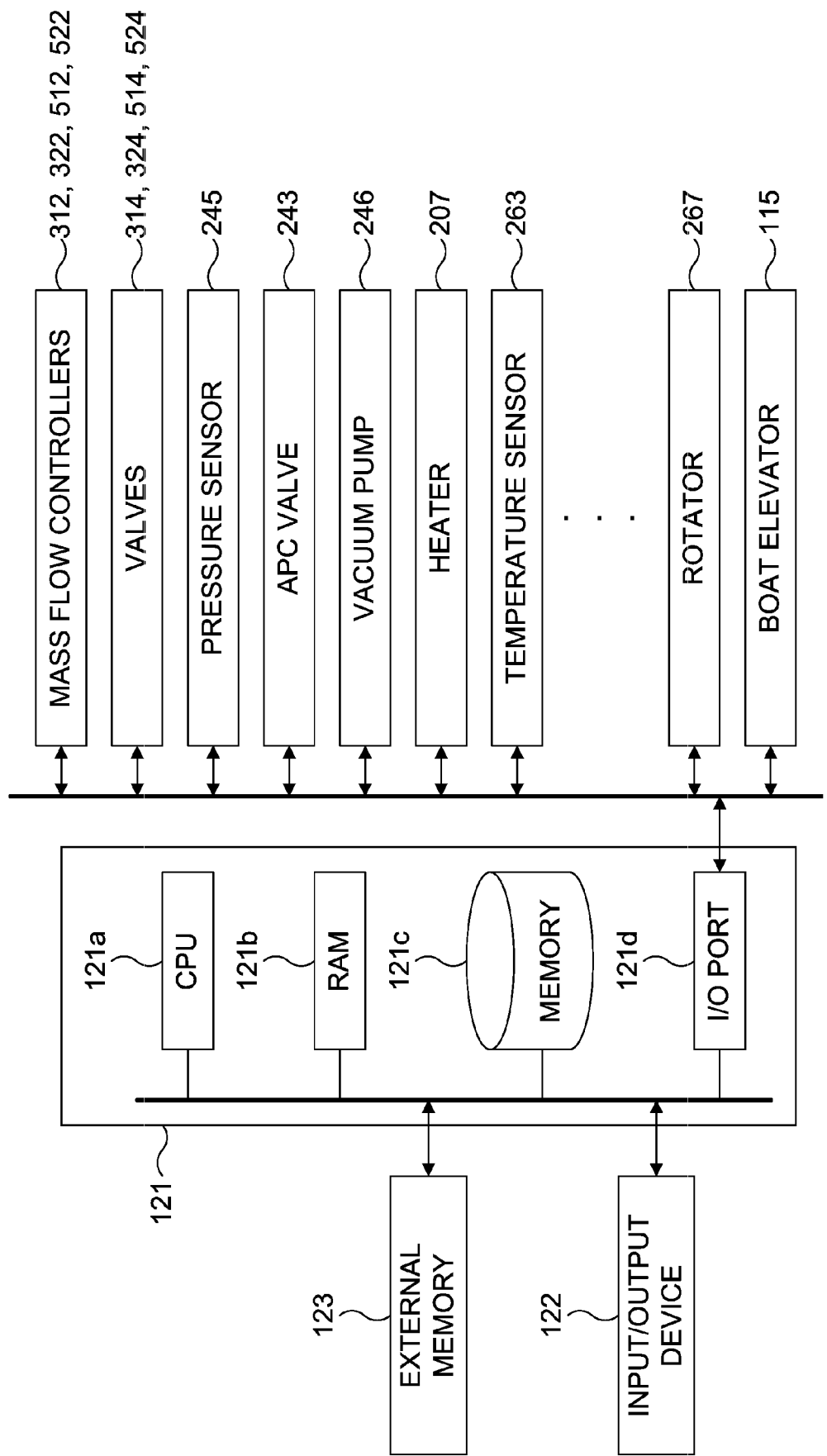

SUBSTRATE PROCESSING APPARATUS, GAS NOZZLE AND METHOD OF MANUFACTURING SEMICONDUCTOR DEVICE

CROSS REFERENCE TO RELATED APPLICATIONS

This application is a continuation of International Application No. PCT/JP2019/008379, filed on Mar. 4, 2019, which claims priority under 35 U.S.C. § 119 to Application No. JP 2018-063255 filed on Mar. 28, 2018, the entire contents of which are hereby incorporated by reference.

TECHNICAL FIELD

The present disclosure relates to a substrate processing apparatus, a gas nozzle and a method of manufacturing a semiconductor device.

BACKGROUND

When processing a substrate to form a film on the substrate using a substrate processing apparatus, a source gas may be supplied through a source gas nozzle into a reaction tube in which the substrate is accommodated. When the source gas is supplied through the source gas nozzle into the reaction tube in which the substrate is accommodated, the source gas nozzle may also be heated to a substrate processing temperature, and foreign matters may be generated in the source gas nozzle. Thus, a stable operation of the substrate processing apparatus may be hindered.

SUMMARY

Described herein is a technique capable of suppressing or preventing an inside of a source gas nozzle from being heated to a substrate processing temperature.

According to one aspect of the technique of the present disclosure, there is provided a processing apparatus including: a reaction tube made of a first material and capable of accommodating a substrate; and a source gas nozzle provided in the reaction tube and at least a part thereof made of a second material whose reflectance is higher than that of the first material and whose surface is rougher than that of the first material by bubbles contained therein, wherein a source gas is supplied through the source gas nozzle.

BRIEF DESCRIPTION OF THE DRAWINGS

FIGS. 4A and 4B schematically illustrate a vertical cross-section of the source gas nozzle used in the substrate processing apparatus according to the embodiments described herein and according to a comparative example for explaining a gas flow in the source gas nozzle.

FIGS. 5A through 5C schematically illustrate vertical cross-sections of the substrate processing apparatus and the source gas nozzle used in the substrate processing apparatus according to the embodiments described herein for explaining the source gas nozzle.

FIG. 6 is a block diagram schematically illustrating a configuration of a controller and related components of the substrate processing apparatus according to the embodiments described herein.

DETAILED DESCRIPTION

Figure 1:
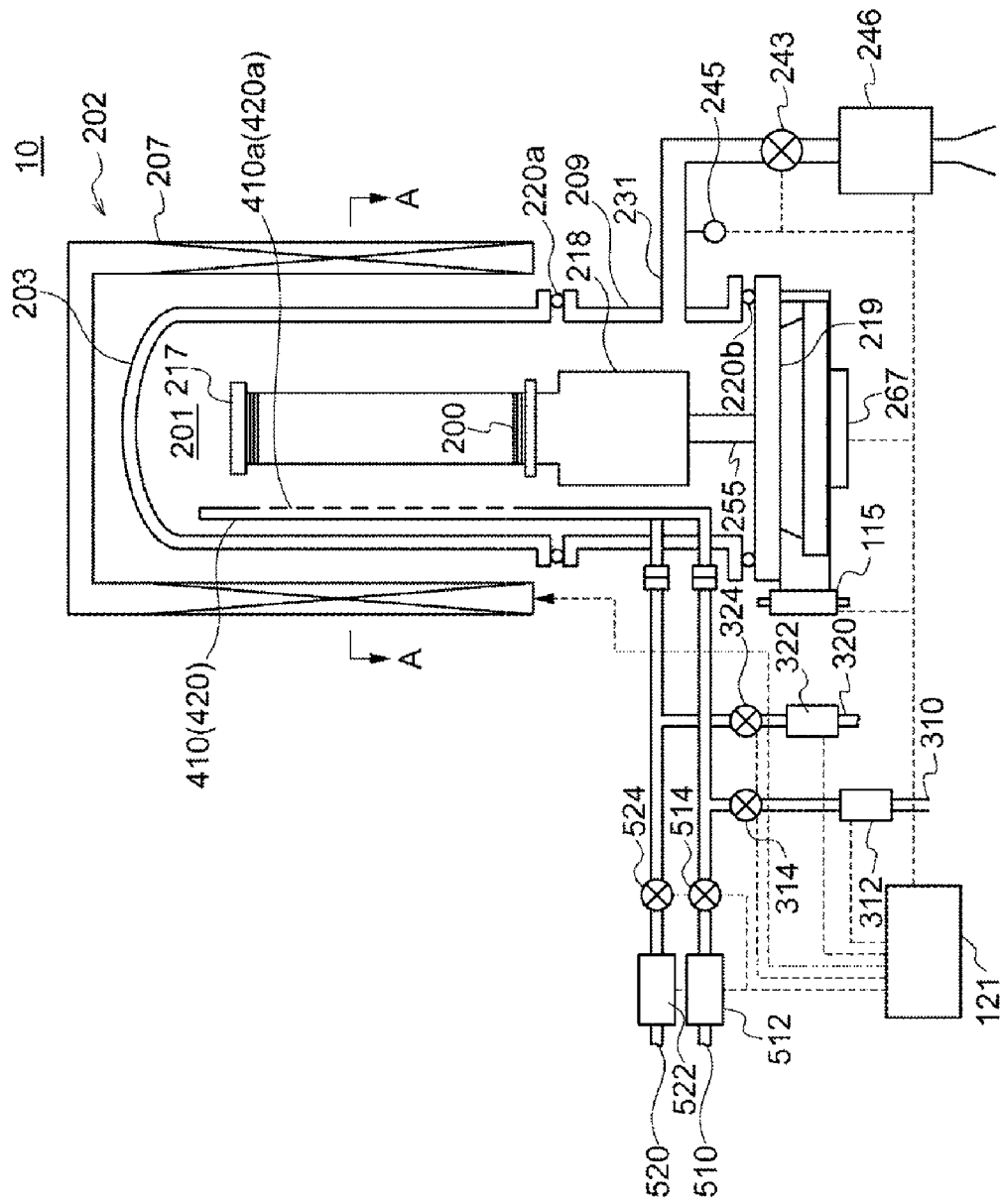
FIG. 1 schematically illustrates a vertical cross-section of a substrate processing apparatus preferably used to form a film on a substrate according to one or more embodiments described herein.

Hereinafter, one or more embodiments (also simply referred to as "embodiments") according to the technique of the present disclosure will be described.

In recent years, as a density of a semiconductor device increases, there is a wide variety of demands for films used to form the semiconductor device. For example, it is difficult to form a silicon oxide film (hereinafter, also referred to as a "SiO film") of 1.6 nm thickness due to electrical restrictions, but it is possible to form a hafnium oxide film (hereinafter, also referred to as a "HfO film") of 4.5 nm thickness serving as a high dielectric constant film, whose capacitance is equivalent to that of the SiO film of 1.6 nm thickness.

With the introduction of the high dielectric constant film, a film such as an aluminum oxide film (hereinafter, also referred to as an "AlO film"), the HfO film and a zirconium oxide film (hereinafter, also referred to as a "ZrO film") may be used as an insulating film, especially as an insulating film for a DRAM capacitor. As a method of manufacturing the film such as the AlO film, the HfO film and the ZrO film, a film-forming method of alternately supplying a gasified (or vaporized) liquid source of an organic compound serving as a first material vaporized by a vaporizer and ozone serving as a second material into a process chamber is dominant. For example, as the organic compound serving as the first material, a compound such as TMA (trimethylaluminum, $(CH_3)_3Al$), TEMAH (tetrakis ethylmethylamino hafnium, $Hf[N(CH_3)CH_2CH_3]_4$) and TEMAZ (tetrakis ethylmethylamino zirconium, $Zr[N(CH_3)CH_2CH_3]_4$) may be used.

When the film is formed by using the organic compound such as the TMA, the TEMAH and the TEMAZ, organic substances may easily enter the film. In order to prevent the organic substances from entering the film when the film is formed, it is preferable to elevate a temperature of a substrate as much as possible. However, a heat resistance of the organic compound is generally low. Therefore, for example, when the TMA is used as the organic compound and a temperature of the process chamber is elevated to a temperature ranging from 450° C. to 500° C. or higher, problems such as a deterioration of a thickness uniformity of the film and a generation of foreign matters are likely to occur.

Disclosers of the present application have discovered that the problems described above are caused due to the fact that a temperature of a source gas such as the organic compound in a source gas nozzle configured to supply the source gas becomes equal to the temperature of the substrate in the process chamber.

As a result of intensive research, the disclosers of the present application have discovered that, by forming at least a part of the source gas nozzle by a material whose reflectance is higher than that of a material of a reaction tube constituting the process chamber and by making a surface of the source gas nozzle rougher than a surface of the material of the reaction tube by bubbles contained in the material of a high reflectance, the temperature of the source gas in the source gas nozzle configured to supply the source gas such as the organic compound can be lower than an inner temperature of the process chamber, and as a result, it is possible to suppress or prevent the deterioration of the thickness uniformity of the film, and it is also possible to suppress or prevent the generation of the foreign matters.

The preferred embodiments according to the technique described herein are based on the result of the intensive research, and will be described in detail with reference to the drawings.

First Embodiment

As shown in FIG. 1, a substrate processing apparatus 10 according to a preferred first embodiment includes a process furnace 202. The process furnace 202 includes a heater 207 serving as a heating device (temperature regulator). The heater 207 is of a cylindrical shape, and is vertically installed while being supported by a heater base (not shown) serving as a support plate. The heater 207 is configured to heat an inside of a process chamber 201 described later at a predetermined temperature using the infrared ray.

A reaction tube 203 is provided in an inner side of the heater 207 to be aligned in a manner concentric with the heater 207. For example, the reaction tube 203 is made of a heat resistant material such as quartz ($SiO_2$). The reaction tube 203 is of a cylindrical shape with a closed upper end and an open lower end. A manifold (which is an inlet flange) 209 is provided under the reaction tube 203 to be aligned in a manner concentric with the reaction tube 203. The manifold 209 is made of a metal such as stainless steel (SUS). The manifold 209 is of a cylindrical shape with open upper and lower ends. The upper end of the manifold 209 is engaged with the lower end of the reaction tube 203 so as to support the reaction tube 203. An O-ring 220a serving as a seal is provided between the manifold 209 and the reaction tube 203. As the manifold 209 is supported by the heater base (not shown), the reaction tube 203 is installed vertically. A process vessel (also referred to as a "reaction vessel") is constituted mainly by the reaction tube 203 and the manifold 209. The process chamber 201 is provided in a hollow cylindrical portion of the process vessel. The process chamber 201 is configured to accommodate a plurality of wafers including a wafer 200 serving as a substrate vertically in a horizontal orientation in a multistage manner by a boat 217 described later. The heater 207 is provided so as to heat at least one end (for example, a lower end) to the other end (for example, an upper end) of a wafer arrangement region (also referred to as a "wafer region") in which the plurality of the wafers are arranged.

Nozzles 410 and 420 are provided in the process chamber 201 so as to penetrate a side wall of the manifold 209. Gas supply pipes 310 and 320 serving as gas supply lines are connected to the nozzles 410 and 420, respectively. For example, the number of nozzles may be changed appropriately as necessary. As described above, the two nozzles 410 and 420 and the two gas supply pipes 310 and 320 are connected to the process vessel (the manifold 209), and various gases may be supplied into the process chamber 201 via the two nozzles 410 and 420 and the two gas supply pipes 310 and 320.

Mass flow controllers 312 and 322 serving as flow rate controllers (flow rate control devices) and valves 314 and 324 serving as opening/closing valves are sequentially installed at the gas supply pipes 310 and 320, respectively, from upstream sides to downstream sides of the gas supply pipes 310 and 320. Hereinafter, a mass flow controller is also referred to as an "MFC". Gas supply pipes 510 and 520 configured to supply an inert gas are connected to the gas supply pipes 310 and 320 at downstream sides of the valves 314 and 324 of the gas supply pipes 310 and 320, respectively. MFCs 512 and 522 and valves 514 and 524 are sequentially installed at the gas supply pipes 510 and 520, respectively, from upstream sides to downstream sides of the gas supply pipes 510 and 520.

Figure 2:
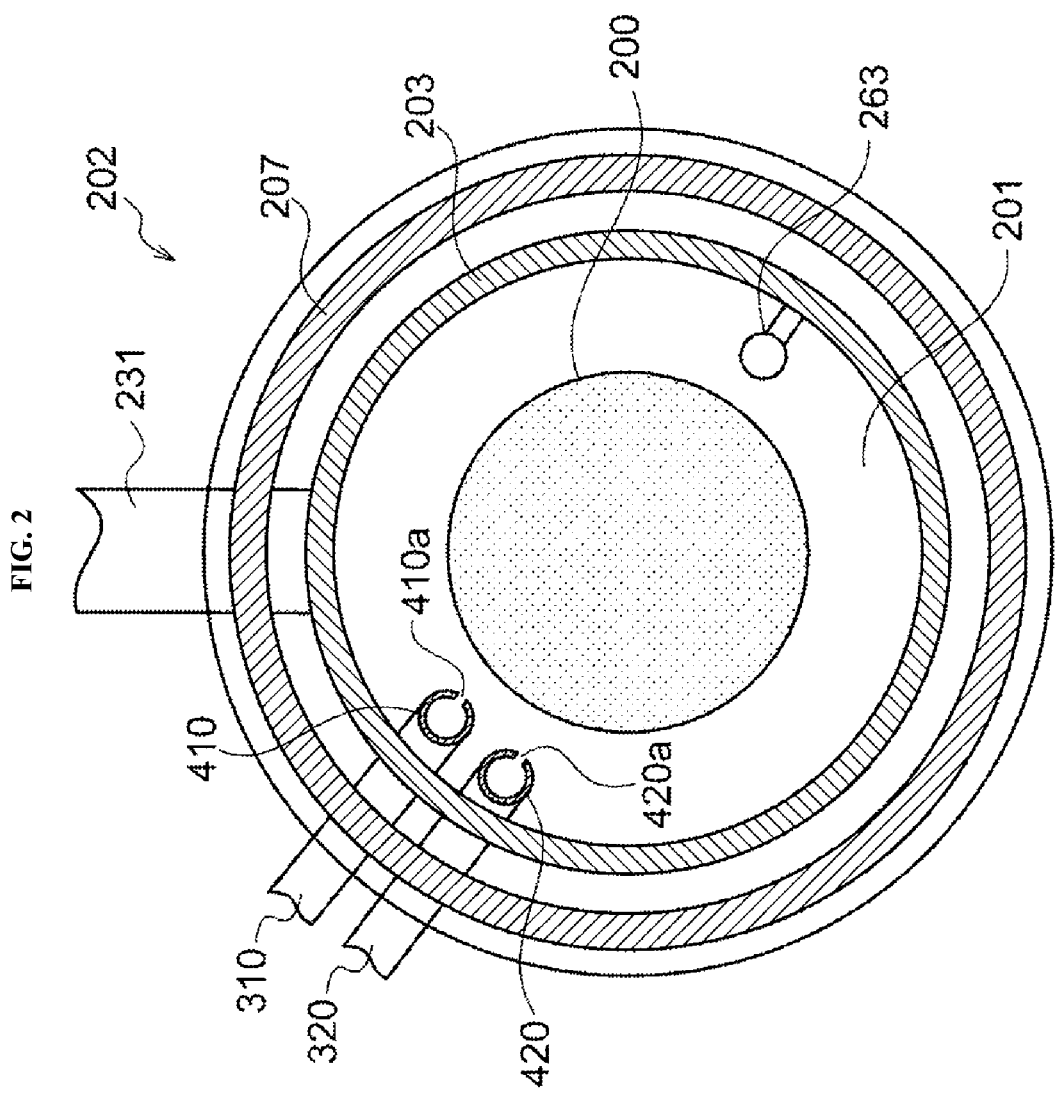
FIG. 2 schematically illustrates a horizontal cross-section taken along the line A-A' of the substrate processing apparatus shown in FIG. 1 according to the embodiments described herein.

The nozzles 410 and 420 are connected to front ends of the gas supply pipes 310 and 320, respectively. As shown in FIG. 2, the nozzles 410 and 420 are installed in an annular space between an inner wall of the reaction tube 203 and the plurality of the wafers including the wafer 200 accommodated in the process chamber 201 when viewed from above, and extend from a lower portion of the inner wall of the reaction tube 203 to an upper portion of the inner wall of the reaction tube 203 along a stacking direction of the plurality of the wafers, respectively. That is, the nozzles 410 and 420 are provided in a region that horizontally surrounds the wafer arrangement region where the plurality of the wafers are arranged along the stacking direction of the plurality of the wafers. That is, the nozzles 410 and 420 are provided at edges (peripheral portions) of the plurality of the wafers accommodated in the process chamber 201, respectively. In other words, the nozzles 410 and 420 are provided perpendicularly to surfaces (flat surfaces) of the plurality of the wafers, respectively. The nozzles 410 and 420 may include L-shaped nozzles, respectively. Horizontal portions of the nozzles 410 and 420 are installed through the side wall of the manifold 209. Vertical portions of the nozzles 410 and 420 extend from the lower end to the upper end of the wafer arrangement region.

A plurality of gas supply holes (which are first gas supply holes or source gas supply holes) 410a and a plurality of gas supply holes 420a, which are configured to supply the gas such as the source gas and a reactive gas, are provided at side surfaces of the nozzles 410 and 420 at positions facing the plurality of the wafers including the wafer 200 arranged in the wafer arrangement region, respectively. The plurality of the gas supply holes 410a and the plurality of the gas supply holes 420a are open toward a center of the reaction tube 203, and are configured to supply the gas toward the plurality of the wafers accommodated in the process chamber 201. The plurality of the gas supply holes 410a and the plurality of the gas supply holes 420a are provided in a region of the reaction tube 203 where the plurality of the wafers are arranged, that is, at positions facing a substrate support (that is the boat 217) described later. In other words, the plurality of the gas supply holes 410a and the plurality of the gas supply holes 420a are provided from a lower end of the heater 207 to an upper portion of the heater 207.

The plurality of the gas supply holes 410a are provided throughout a range from a lower portion to an upper portion of the reaction tube 203. An opening area of each the gas supply holes 410a is the same, and each of the gas supply holes 410a is provided at the same pitch. The plurality of the gas supply holes 420a are provided throughout a range from the lower portion to the upper portion of the reaction tube 203. An opening area of each of the gas supply holes 420a is the same, and each of the gas supply holes 420a is provided at the same pitch. However, the plurality of the gas supply holes 410a and the plurality of the gas supply holes 420a are not limited thereto. For example, the opening area of each of the gas supply holes 420a may gradually increase from a lower portion (upstream side) toward an upper portion (downstream side) of the nozzle 420 to further uniformize a flow rate of the gas supplied through the plurality of the gas supply holes 420a. The same may also be applied to the plurality of the gas supply holes 410a.

According to the first embodiment, gases such as the source gas and the reactive gas are supplied through the nozzles 410 and 420 provided in the vertical annular space (that is, a cylindrical space) defined by an inner surface of the side wall (that is, the inner wall) of the reaction tube 203 and the edges (peripheral portions) of the plurality of the wafers including the wafer 200 arranged in the reaction tube 203. Then, the gases are ejected into the reaction tube 203 in the vicinity of the plurality of the wafers through the plurality of the gas supply holes 410a and the plurality of the gas supply holes 420a of the nozzles 410 and 420, respectively. The gases ejected into the reaction tube 203 mainly flow parallel to the surfaces of the plurality of the wafers, that is, in a horizontal direction.

The source gas is supplied into the process chamber 201 through the gas supply pipe 310 provided with the MFC 312 and the valve 314 and the nozzle 410. As the source gas, for example, TMA gas containing aluminum (Al) which is a metal element may be used when forming the AlO film, TEMAH gas containing hafnium (Hf) which is a metal element may be used when forming the HfO film, TEMAZ gas containing zirconium (Zr) which is a metal element may be used when forming the ZrO film. That is, the organic compound which is a metal-containing gas may be preferably used as the source gas. Alternatively, an inorganic compound may be used as the source gas depending on a type of a film to be formed. When the source gas is supplied through the nozzle 410, the nozzle 410 may be referred to as a "source gas nozzle".

In the present specification, the term "source gas" may refer to a source material in a gaseous state under the normal temperature and the normal pressure (that is, the atmospheric pressure) or a gas obtained by vaporizing a source material in a liquid state (that is, a liquid source) under the normal temperature and the normal pressure. In the present specification, the term "source material" may indicate only "source material in a liquid state", may indicate only "source material (source gas) in a gaseous state" and may indicate both of "source material in the liquid state" and "source material in the gaseous state". Since the organic compound such as the TMA, the TEMAH and the TEMAZ is a liquid source, the organic compound gasified (or vaporized) by a component such as a vaporizer may be used as the source gas.

The reactive gas whose molecular structure is different from that of the source gas is supplied into the process chamber 201 through the gas supply pipe 320 provided with the MFC 322 and the valve 324 and the nozzle 420. For example, when an oxide film such as the AlO film, the HfO film and the ZrO film is formed as the film, an oxygen-containing gas (which is an oxidizing gas or an oxidizing agent) may be used as the reactive gas (which is a reactant) containing oxygen (O) and reacting with an element such as aluminum (Al), hafnium (Hf) and zirconium (Zr). For example, ozone ($O_3$) gas may be used as the oxygen-containing gas (that is, the reactive gas). For example, the ozone gas is supplied from a component such as an ozone generator.

The inert gas such as nitrogen ($N_2$) gas is supplied into the process chamber 201 through the gas supply pipes 510 and 520 provided with the MFCs 512 and 522 and the valves 514 and 524, respectively, the gas supply pipes 310 and 320 and the nozzles 410 and 420.

When the source gas is supplied through the gas supply pipe 310, a source gas supply system is constituted mainly by the gas supply pipe 310, the MFC 312, the valve 314 and the nozzle 410. The source gas supply system may also be referred to as a "source supply system". When the metal-containing gas is supplied through the gas supply pipe 310, the source gas supply system may also be referred to as a "metal-containing gas supply system".

When the reactive gas (that is, the reactant) is supplied through the gas supply pipe 320, a reactive gas supply system is constituted mainly by the gas supply pipe 320, the MFC 322, the valve 324 and the nozzle 420. When the oxygen-containing gas (that is, the oxidizing gas or the oxidizing agent) is supplied as the reactive gas and the reactive gas is supplied through the nozzle 420, the nozzle 420 may also be referred to as a "reactive gas nozzle".

An inert gas supply system is constituted mainly by the gas supply pipes 510 and 520, the MFCs 512 and 522 and the valves 514 and 524.

The source gas supply system and the reactive gas supply system may be collectively referred to as a gas supply system. The gas supply system may further include the inert gas supply system.

Figure 9:
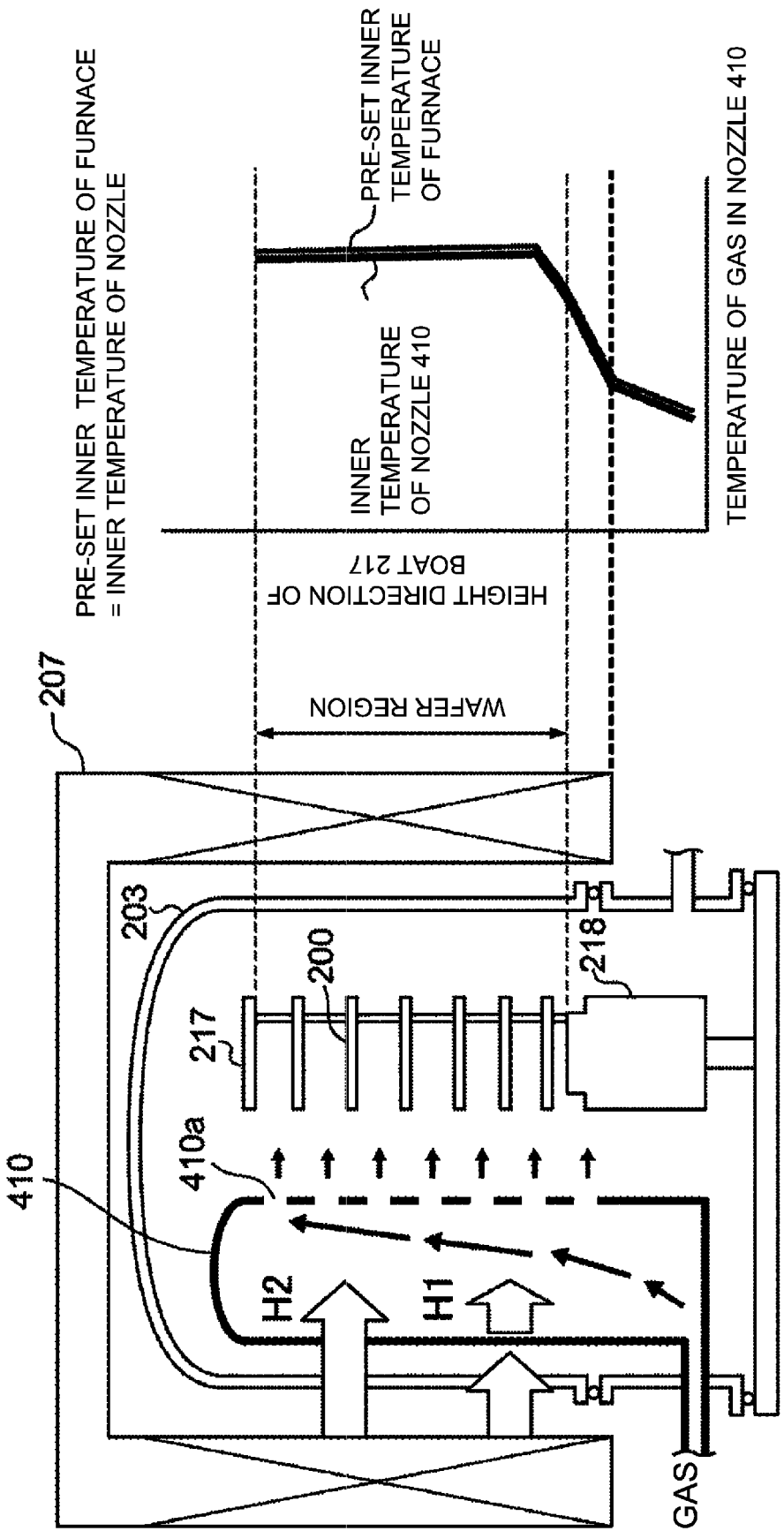
FIG. 9 is a diagram for explaining a source gas nozzle used in a substrate processing apparatus according to the comparative example and an inner temperature of the source gas nozzle according to a comparative example.

Subsequently, the nozzle 410 configured to supply the source gas will be described in detail. The reaction tube 203 constituting the process chamber 201 is made of transparent quartz (which is a first material) whose reflectance with respect to the infrared ray is low. When the nozzle 410 is also made of the transparent quartz, which is the same material as the material of the reaction tube 203 constituting the process chamber 201 and whose reflectance with respect to the infrared ray is low, according to a comparative example as shown in FIG. 9, the nozzle 410 is heated due to the absorption of the infrared ray from the heater 207, and the gas flowing inside the nozzle 410 is also heated by the heat conduction (indicated by "H1" in FIG. 9) from an inner wall of the nozzle 410 and the absorption of the infrared ray (indicated by "H2" in FIG. 9) from the heater 207. When the gas flowing inside the nozzle 410 is heated, a temperature of the gas flowing inside the nozzle 410 (also referred to as a "inner temperature of the nozzle 410") is almost the same as a pre-set inner temperature of a furnace (that is, an inner temperature of the reaction tube 203), and is almost the same as a temperature of the wafer 200.

When the temperature of the wafer 200 is increased by increasing the pre-set inner temperature of the furnace, the organic substances may hardly enter the film. However, the temperature of the gas flowing inside the nozzle 410 is also increased. Since the heat resistance of the organic compound of the source gas such as the TMA, the TEMAH and the TEMAZ flowing inside the nozzle 410 is low, the organic compound is thermally decomposed in the nozzle 410, an inner pressure of the nozzle 410 is higher than an inner pressure of the process chamber 201 in which the plurality of the wafers including the wafer 200 is accommodated. Therefore, the foreign matters may be generated in the nozzle 410, and the foreign matters may be mixed into the film. In addition, as a film-forming rate increases due to the thermal decomposition of the source gas, the thickness uniformity of the film may also deteriorate. On the other hand, when the pre-set inner temperature of the furnace is decreased, the temperature of the gas flowing inside the nozzle 410 is also decreased. Therefore, the foreign matters are hardly generated in the nozzle 410. However, since the temperature of the wafer 200 is also decreased, the organic substances may easily enter the film formed on the wafer 200.

Figure 3:
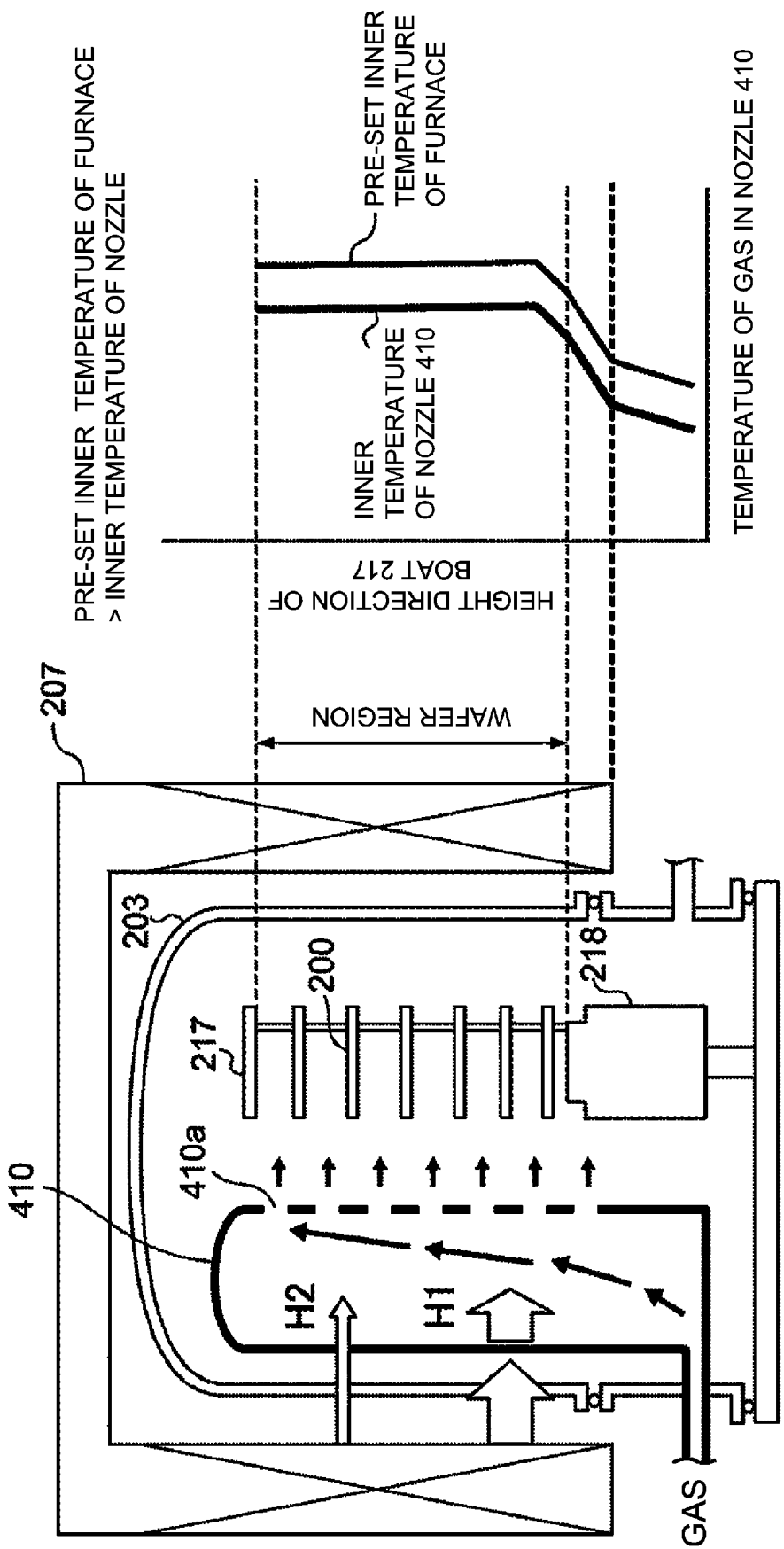
FIG. 3 is a diagram for explaining a source gas nozzle used in the substrate processing apparatus according to the embodiments described herein and an inner temperature of the source gas nozzle.

According to the first embodiment, the reaction tube 203 constituting the process chamber 201 is made of the transparent quartz whose reflectance with respect to the infrared ray is low. However, the nozzle 410 is made of opaque quartz (which is a second material) whose reflectance for the infrared ray is higher than that of the first material constituting the reaction tube 203. As shown in FIG. 3, the nozzle 410 is heated due to the absorption of the infrared ray from the heater 207, and the gas flowing inside the nozzle 410 is also heated by the heat conduction (indicated by "H1" in FIG. 3) from the inner wall of the nozzle 410 and the absorption of the infrared ray (indicated by "H2" in FIG. 3) from the heater 207. However, since the nozzle 410 is made of the opaque quartz whose reflectance with respect to the infrared ray is high, the absorption of the infrared ray (indicated by "H2" in FIG. 3) from the heater 207 is reduced as compared with the comparative example. As a result, the temperature of the gas flowing inside the nozzle 410 is lower than the pre-set inner temperature of the furnace (that is, the inner temperature of the reaction tube 203).

In addition, the opaque quartz whose reflectance with respect to the infrared ray is high and constituting the nozzle 410 contains bubbles therein. Therefore, an inner surface of the nozzle 410 is of a minute concave-convex shape due to the bubbles. As a result, a surface of the opaque quartz constituting the nozzle 410 can be made rougher than a surface of the transparent quartz (that is, the first material) constituting the reaction tube 203. When the transparent quartz whose reflectance with respect to the infrared ray is low is used for the nozzle 410 according to the comparative example, the inner surface of the nozzle 410 is very smooth. Therefore, a gas flow in the nozzle 410 becomes a laminar flow as shown in FIG. 4A, and a flow velocity of the gas decreases as it approaches the inner wall of the nozzle 410. On the other hand, when the opaque quartz whose inner surface is of a minute concave-convex shape is used for the nozzle 410 according to the first embodiment, the gas flow in the nozzle 410 becomes a turbulent flow as shown in FIG. 4B. Although an average flow velocity of the gas of the turbulent flow is slightly smaller than that of the gas of the laminar flow, the flow velocity adjacent to a surface of the inner wall of the nozzle 410 increases, and the heat conduction (indicated by "H1" in FIG. 3) from the inner wall of the nozzle 410 decreases. Therefore, the gas flowing inside the nozzle 410 is less likely to be heated.

As described above, the temperature of the gas flowing inside the nozzle 410 is lower than the pre-set inner temperature of the furnace or the temperature of the wafer 200. Therefore, when the temperature of the wafer 200 is elevated to form the film on the wafer 200, the organic substances hardly enter the film and the foreign matters are hardly generated in the nozzle 410.

Further, the nozzle 410 may be made of a plurality of quartz materials whose reflectances with respect to the infrared ray are different from one another depending on the heat load. As shown in FIG. 5A, according to the first embodiment, the L-shaped nozzle 410 is made of the opaque quartz 411 whose reflectance is high from a lower end to an upper end of the nozzle 410. However, the nozzle 410 may be made of the plurality of the quartz materials whose reflectances are different from one another depending on the heat load. For example, as shown in FIG. 5B, a lower portion (upstream side) of the nozzle 410 below a heater region uniformly heated by the heater 207 may be made of the transparent quartz 412 whose reflectance is low, and the heater region of the nozzle 410 above (downstream side) the lower portion in FIG. 5B may be made of the opaque quartz 411 whose reflectance is high. For example, as shown in FIG. 5C, a lower portion (upstream side) of the nozzle 410 to the middle of the wafer region where the plurality of the wafers are arranged may be made of the transparent quartz 412 whose reflectance is low, and a portion above (downstream of) the lower portion in FIG. 5C may be made of the opaque quartz 411 whose reflectance is high. That is, the nozzle 410 may be entirely made of the opaque quartz 411 whose reflectance is high (that is, the second material), or alternatively, a part of the nozzle 410 may be made of the opaque quartz 411 whose reflectance is high (that is, the second material). When the lower portion (upstream side) of the nozzle 410 is made of the transparent quartz 412 whose reflectance is low, it is possible to efficiently preheat the gas. When the lower portion of the nozzle 410 is made of the opaque quartz 411 whose reflectance is high, it is possible to suppress the thermal decomposition of the gas. As a result, according to the present embodiment, it is possible to efficiently preheat the gas while suppressing the thermal decomposition of the gas.

In addition, by cooling the gas itself supplied into the nozzle 410 by providing a tank (not shown) configured to store the source gas in the middle of the gas supply pipe 510 upstream of the nozzle 410, providing a valve (not shown) at the gas supply pipe 510 connected to the tank and supplying the source gas compressed in the tank into the nozzle 410, it is possible to further lower the temperature of the gas flowing inside the nozzle 410. That is, the source gas supply system may further include the tank (not shown), the gas supply pipe 510 and the valve (not shown).

The nozzle 420 may be made of the transparent quartz which is the same material as the material of the reaction tube 203 constituting the process chamber 201 and whose reflectance is low for the infrared ray. However, the nozzle 420 may be made of a material different from the transparent quartz constituting the reaction tube 203.

For example, the nozzle 420 may be made of a material (which is a third material) whose reflectance with respect to the infrared ray is lower than that of the first material and that of the second material. As a result, the gas flowing through the nozzle 420 can easily absorb the heat energy to accelerate the heating of the gas. Therefore, it is possible to quickly and evenly heat the gas to the same temperature as the temperature of the wafer 200, and it is also possible to easily activate the gas. In addition, it is possible to suppress the reliquefaction of the gas. It is preferable that a heating temperature of the gas in the nozzle 420 is lower than a thermal decomposition temperature of each gas such as the source gas and the reactive gas. For example, when the transparent quartz which is synthetic quartz is used as the first material, fused quartz whose reflectance is lower than that of the synthetic quartz may be applied as the third material. The material whose reflectance is lower than that of the first material and whose surface is smoother than that of the first material may be used as the third material, or the material whose reflectance is lower than that of the second material and whose surface is smoother than that of the second material may be used as the third material.

For example, the nozzle 420 may be made of a material (which is a fourth material) whose absorptance with respect to the infrared ray is higher than that of the first material and that of the second material. As a result, the gas flowing through the nozzle 420 can easily absorb the heat energy to accelerate the heating of the gas. Therefore, it is possible to quickly and evenly heat the gas to the same temperature as the temperature of the wafer 200, and it is also possible to easily activate the gas. In addition, it is possible to suppress the reliquefaction of the gas. It is preferable that the heating temperature of the gas in the nozzle 420 is lower than the thermal decomposition temperature of each gas such as the source gas and the reactive gas. For example, black quartz may be used as the fourth material.

Preferably, an infrared transmittance of the transparent quartz whose reflectance with respect to the infrared ray is low may range from 80% to 90%, the reflectance of the transparent quartz may range from 5% to 15%, and the absorptance of the transparent quartz may range from 5% to 10%. Preferably, the infrared transmittance of the opaque quartz whose reflectance with respect to the infrared ray is high may be lower than 10%, the reflectance of the opaque quartz may range from 75% to 90%, and the absorptance of the opaque quartz may range from 5% to 15%. Preferably, the infrared transmittance of the black quartz whose absorptance with respect to the infrared ray is high may be lower than 2%, the reflectance of the black quartz may range from 5% to 15%, and the absorptance of the black quartz may range from 80% to 90%. Each of the above-mentioned values is selected such that the sum of the infrared transmittance, the reflectance and absorptance of each quartz is equal to 100%.

The higher the reflectance of the opaque quartz, the better. When the reflectance of the opaque quartz is lower than 75%, an inside of the nozzle 410 may be heated to a substrate processing temperature such as an inner temperature of the process chamber 201 in a film-forming step S110 described later, and the foreign matters may be generated in the nozzle 410.

An exhaust pipe 231 serving as an exhaust flow path configured to exhaust an inner atmosphere of the process chamber 201 is provided at the manifold 209. A vacuum pump 246 serving as a vacuum exhaust apparatus is connected to the exhaust pipe 231 through a pressure sensor 245 and an APC (Automatic Pressure Controller) valve 243. The pressure sensor 245 serves as a pressure detector (pressure detection device) to detect the inner pressure of the process chamber 201, and the APC valve 243 serves as an exhaust valve (pressure regulator). With the vacuum pump 246 in operation, the APC valve 243 may be opened or closed to vacuum-exhaust the process chamber 201 or stop the vacuum exhaust. With the vacuum pump 246 in operation, an opening degree of the APC valve 243 may be adjusted based on pressure information detected by the pressure sensor 245, in order to control (adjust) the inner pressure of the process chamber 201. An exhaust system is constituted mainly by the exhaust pipe 231, the APC valve 243 and the pressure sensor 245. The exhaust system may further include the vacuum pump 246.

A seal cap 219 serving as a furnace opening lid capable of airtightly sealing a lower end opening of the manifold 209 is provided under the manifold 209. The seal cap 219 is in contact with the lower end of the manifold 209 from thereunder. The seal cap 219 is made of a metal such as SUS (stainless steel), and is of a disk shape. An O-ring 220b serving as a seal provided on an upper surface of the seal cap 219 so as to be in contact with the lower end of the manifold 209. A rotator 267 configured to rotate the boat 217 described later is provided under the seal cap 219 opposite to the process chamber 201. A rotating shaft 255 of the rotator 267 is connected to the boat 217 through the seal cap 219. As the rotator 267 rotates the boat 217, the plurality of the wafers including the wafer 200 supported by the boat 217 are rotated. A boat elevator 115 serving as an elevator is provided outside the reaction tube 203 vertically. The seal cap 219 may be elevated or lowered in the vertical direction by the boat elevator 115. When the seal cap 219 is elevated or lowered by the boat elevator 115, the boat 217 placed on the seal cap 219 may be transferred (loaded) into the process chamber 201 or transferred (unloaded) out of the process chamber 201. The boat elevator 115 serves as a transfer device (or a transport device) capable of loading the boat 217 (that is, the plurality of the wafers including the wafer 200 accommodated in the boat 217) into the process chamber 201 or unloading the boat 217 (that is, the plurality of the wafers including the wafer 200 accommodated in the boat 217) out of the process chamber 201. A shutter (not shown) serving as a furnace opening lid capable of airtightly sealing the lower end opening of the manifold 209 is provided under the manifold 209. The shutter (not shown) is configured to close the lower end opening of the manifold 209 when the seal cap 219 is lowered by the boat elevator 115. The shutter (not shown) is made of a metal such as SUS (stainless steel), and of a disk shape. An O-ring (not shown) serving as a seal is provided on an upper surface of the shutter (not shown) so as to be in contact with the lower end of the manifold 209. An opening/closing operation of the shutter (not shown) such as an elevation operation and a rotation operation is controlled by a shutter opener/closer (which is a shutter opening/closing mechanism, not shown).

The boat 217 (which is a substrate retainer or a substrate support) is configured to align the plurality of the wafers including the wafer 200, for example, from 25 to 200 wafers in the vertical direction and configured to support the plurality of the wafers, while the plurality of the wafers are horizontally oriented with their centers aligned with each other. That is, the boat 217 supports (accommodates) the plurality of the wafers including the wafer 200 with a predetermined interval therebetween. The boat 217 is made of a heat resistant material such as quartz and SiC. Insulating plates (not shown) are provided under the boat 217 in a multistage manner. The insulating plates are made of a heat resistant material such as quartz and SiC. The insulating plates suppress the transmission of heat from the heater 207 to the seal cap 219. However, the first embodiment is not limited thereto. For example, instead of the insulating plates, a heat insulating cylinder 218 may be provided as a cylinder made of a heat resistant material such as quartz and SiC.

A temperature sensor 263 serving as a temperature detector is provided in the reaction tube 203. The state of electric conduction to the heater 207 is adjusted based on temperature information detected by the temperature sensor 263 such that a desired temperature distribution of the inner temperature of the process chamber 201 is obtained. Similar to the nozzles 410 and 420, the temperature sensor 263 is L-shaped and is provided along the inner wall of the reaction tube 203.

As shown in FIG. 6, a controller 121 serving as a control device (control mechanism) is constituted by a computer including a CPU (Central Processing Unit) 121a, a RAM (Random Access Memory) 121b, a memory 121c and an I/O port 121d. The RAM 121b, the memory 121c and the I/O port 121d may exchange data with the CPU 121a through an internal bus. For example, an input/output device 122 such as a touch panel is connected to the controller 121.

The memory 121c is configured by components such as a flash memory and a hard disk drive (HDD). For example, a control program configured to control the operation of the substrate processing apparatus 10 or a process recipe containing information on the sequences and conditions of a substrate processing such as a film-forming process described later is readably stored in the memory 121c. The process recipe is obtained by combining steps of the film-forming process described later such that the controller 121 can execute the steps to acquire a predetermine result, and functions as a program. Hereafter, the process recipe and the control program may be collectively or individually referred to as a "program". In addition, the process recipe may also be simply referred to as a "recipe". In the present specification, the term "program" may indicate only the process recipe, may indicate only the control program, or may indicate both of the process recipe and the control program. The RAM 121b functions as a memory area (work area) where a program or data read by the CPU 121a is temporarily stored.

The I/O port 121d is connected to the above-described components such as the mass flow controllers (MFCs) 512, 522, 312 and 322, the valves 514, 524, 314 and 324, the pressure sensor 245, the APC valve 243, the vacuum pump 246, the temperature sensor 263, the heater 207, the rotator 267, the boat elevator 115 and the shutter opener/closer (not shown).

The CPU 121a is configured to read a control program from the memory 121c and execute the read control program. In addition, the CPU 121a is configured to read a recipe from the memory 121c in accordance with an operation command inputted from the input/output device 122. According to the contents of the read recipe, the CPU 121a may be configured to control various operations such as flow rate adjusting operations for various gases by the MFCs 512, 522, 312 and 322, opening/closing operations of the valves 514, 524, 314 and 324, an opening/closing operation of the APC valve 243, a pressure adjusting operation by the APC valve 243 based on the pressure sensor 245, a start and stop of the vacuum pump 246, a temperature adjusting operation of the heater 207 based on the temperature sensor 263, an operation of adjusting rotation and rotation speed of the boat 217 by the rotator 267, an elevating and lowering operation of the boat 217 by the boat elevator 115 and an opening/closing operation of the shutter (not shown) by the shutter opener/closer (not shown).

The controller 121 may be embodied by installing the above-described program stored in an external memory 123 into a computer. For example, the external memory 123 may include a magnetic tape, a magnetic disk such as a flexible disk and a hard disk, an optical disk such as a CD and a DVD, a magneto-optical disk such as MO and a semiconductor memory such as a USB memory and a memory card. The memory 121c or the external memory 123 may be embodied by a non-transitory computer readable recording medium. Hereafter, the memory 121c and the external memory 123 are collectively referred to as recording media. In the present specification, the term "recording media" may indicate only the memory 121c, may indicate only the external memory 123, and may indicate both of the memory 121c and the external memory 123. Instead of the external memory 123, a communication means such as the Internet and a dedicated line may be used for providing the program to the computer.

Figure 7:
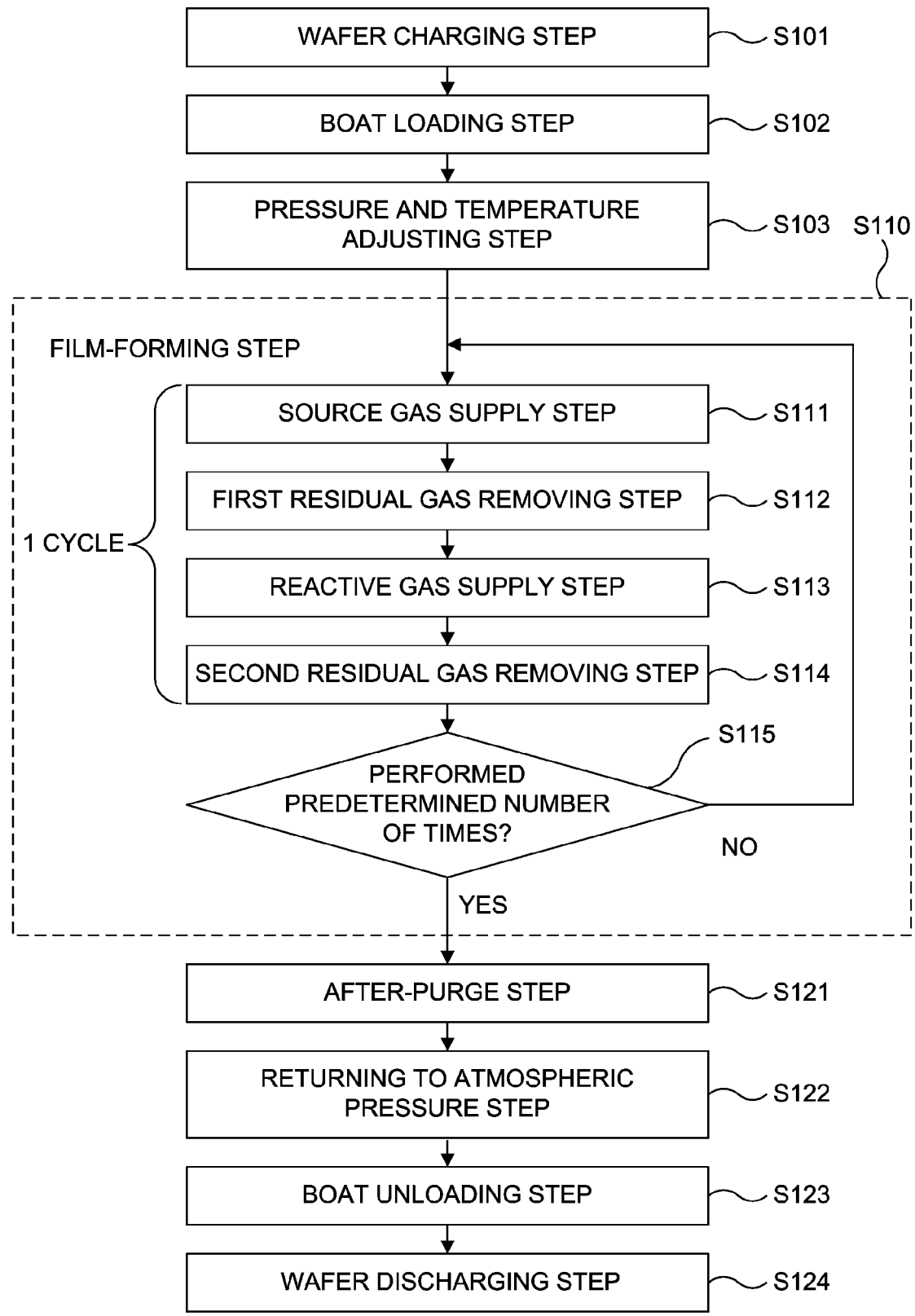
FIG. 7 is a flow chart schematically illustrating an example of a film-forming process according to the embodiments described herein.
Figure 8A:
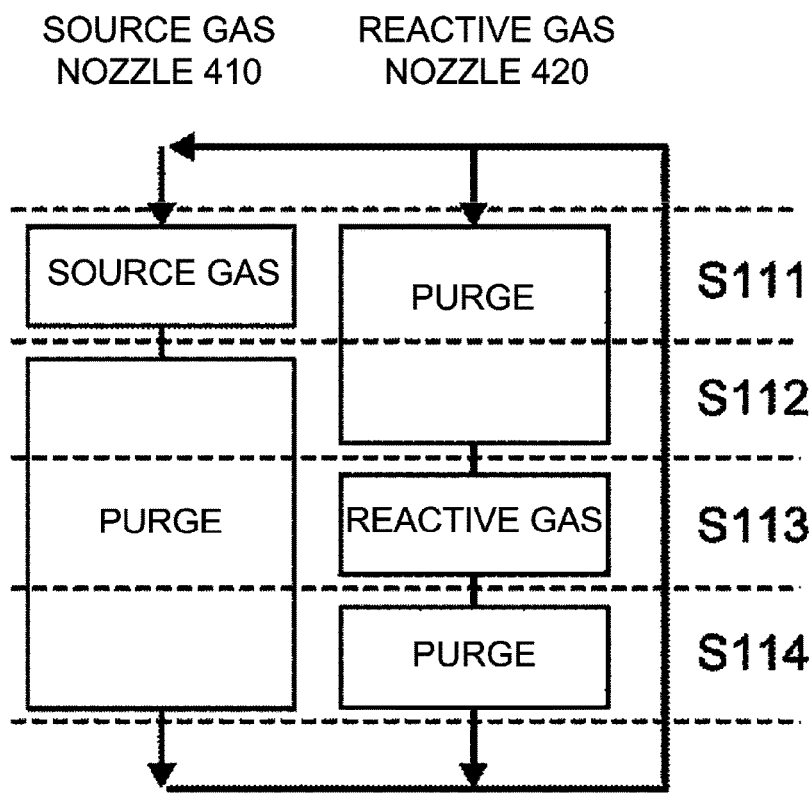
FIGS. 8A and 8B are diagrams for explaining gas flows in the source gas nozzle and a reactive gas nozzle according to the embodiments described herein.

Hereinafter, an exemplary sequence of the substrate processing (that is, the film-forming process) of forming a film on a substrate (that is, the wafer 200), which is a part of manufacturing processes of a semiconductor device, will be described with reference to FIGS. 7 and 8. Hereinafter, operations of components constituting the substrate processing apparatus 10 are controlled by the controller 121.

According to the first embodiment, for example, by performing a cycle a predetermined number of times (n times), an aluminum oxide film (also referred to as an "AlO film") is formed on the wafer 200 as a film containing aluminum (Al) and oxygen (O). For example, the cycle includes: a source gas supply step S111 of supplying the TMA gas serving as the source gas into the process chamber 201 through the plurality of the gas supply holes 410a opened at the nozzle 410 while heating the process chamber 201 by the heater 207 at a predetermined temperature; and a reactive gas supply step S113 of supplying the $O_3$ gas) serving as the reactive gas into the process chamber 201 through the plurality of the gas supply holes 420a opened at the nozzle 420. The plurality of the wafers including the wafer 200 serving as a substrate to be processed is accommodated in the process chamber 201 while supported by (stacked in) the boat 217.

In the present specification, the term "wafer" may refer to "a wafer itself" or may refer to "a wafer and a stacked structure (aggregated structure) of a predetermined layer (or layers) or a film (or films) formed on a surface of the wafer". In the present specification, the term "a surface of a wafer" may refer to "a surface of a wafer itself" or may refer to "a surface of a predetermined layer or a film formed on a wafer". Thus, in the present specification, "forming a predetermined layer (or film) on a wafer" may refer to "forming a predetermined layer (or film) on a surface of a wafer itself" or may refer to "forming a predetermined layer (or film) on a surface of another layer or another film formed on a wafer". In the present specification, the term "substrate" and "wafer" may be used as substantially the same meaning. That is, the term "substrate" may be substituted by "wafer" and vice versa.

Wafer Charging Step S101 and Boat Loading Step S102

The plurality of the wafers including the wafer 200 is charged (transferred) into the boat 217 (wafer charging step S101). After the boat 217 is charged with the plurality of the wafers, the shutter (not shown) is moved by the shutter opener/closer (not shown) to open the lower end opening of the manifold 209 (shutter opening step). Then, as shown in FIG. 1, the boat 217 charged with the plurality of the wafers is elevated by the boat elevator 115 and loaded (transferred) into the process chamber 201 (boat loading step S102). With the boat 217 loaded, the seal cap 219 seals the lower end opening of the manifold 209 via the O-ring 220b.

Pressure and Temperature Adjusting Step S103

The vacuum pump 246 vacuum-exhausts the inner atmosphere of the process chamber 201 until the inner pressure of the process chamber 201 in which the plurality of the wafers including the wafer 200 is accommodated reaches a desired pressure (vacuum degree). In the pressure and temperature adjusting step S103, the inner pressure of the process chamber 201 is measured by the pressure sensor 245, and the APC valve 243 is feedback-controlled based on the measured pressure information (pressure adjusting step). The vacuum pump 246 continuously vacuum-exhausts the inner atmosphere of the process chamber 201 until at least the processing of the wafer 200 is completed. The heater 207 heats the process chamber 201 until the inner temperature of the process chamber 201 reaches a desired temperature. The state of the electric conduction to the heater 207 is feedback-controlled based on the temperature information detected by the temperature sensor 263 such that a desired temperature distribution of the inner temperature of the process chamber 201 is obtained (temperature adjusting step). The heater continuously heats the process chamber 201 until at least the processing of the wafer 200 is completed. Then, the rotator 267 rotates the plurality of the wafers including the wafer 200 by rotating the boat 217. The rotator 267 continuously rotates the boat 217 (that is, the plurality of the wafers) until at least the processing of the wafer 200 is completed.

Film-Forming Step S110

Thereafter, the film-forming step S110 is performed by performing the cycle including the source gas supply step S111, a first residual gas removing step S112, the reactive gas supply step S113 and a second residual gas removing step S114 sequentially a predetermined number of times.

Source Gas Supply Step S111

The valve 314 is opened to supply the TMA gas serving as the source gas into the gas supply pipe 310. After a flow rate of the TMA gas is adjusted by the MFC 312, the TMA gas whose flow rate is adjusted is supplied onto the plurality of the wafers including the wafer 200 through the plurality of the gas supply holes 410a opened at the nozzle 410. That is, the wafer 200 is exposed to the TMA gas. The TMA gas supplied through the plurality of the gas supply holes 410a passes through the inside of the process chamber 201, and is exhausted through the exhaust pipe 231. In the source gas supply step S111, simultaneously, the valve 514 may be opened to supply the $N_2$ gas serving as a carrier gas into the gas supply pipe 510. After a flow rate of the $N_2$ gas is adjusted by the MFC 512, the $N_2$ gas whose flow rate is adjusted is supplied into the process chamber 201 with the TMA gas, and is exhausted through the exhaust pipe 231.

In the source gas supply step S111, in order to prevent the TMA gas from entering the nozzle 420 (that is, in order to prevent a back flow of the TMA gas), the valve 524 may be opened to supply the $N_2$ gas into the gas supply pipe 520. The $N_2$ gas supplied into the gas supply pipe 520 is then supplied into the process chamber 201 through the nozzle 420 (that is, the process chamber 201 is purged), and is exhausted through the exhaust pipe 231.

In the source gas supply step S111, the APC valve 243 is appropriately adjusted (controlled) to adjust the inner pressure of the process chamber 201 to a predetermined pressure. For example, the predetermined pressure of the process chamber 201 in the source gas supply step S111 may range from 1 Pa to 1,000 Pa, preferably from 1 Pa to 100 Pa, and more preferably from 10 Pa to 50 Pa. In the present specification, a numerical range represented by using "from A to B" includes A and B as a lower limit and an upper limit, respectively, of the numerical range. For example, a numerical range of a pressure ranging "from 1 Pa to 1,000 Pa" means a range equal to or more than 1 Pa and equal to or less than 1,000 Pa. That is, the numerical range "from 1 Pa to 1,000 Pa" includes 1 Pa as a lower limit and 1,000 Pa as an upper limit. The same also applies to all numerical ranges of parameters described herein such as a pressure, a time (time duration) and a temperature. In the source gas supply step S111, for example, a supply flow rate of the TMA gas may be set to a predetermined flow rate ranging from 10 sccm to 2,000 sccm, preferably from 50 sccm to 1,000 sccm, and more preferably from 100 sccm to 500 sccm. For example, a supply flow rate of the $N_2$ gas may be set to a predetermined flow rate ranging from 1 slm to 30 slm, preferably from 1 slm to 20 slm, and more preferably from 1 slm to 10 slm. For example, a time duration (also referred to as a "supply time") of supplying the TMA gas to the wafer 200 may be set to a predetermined time ranging from 1 second to 60 seconds, preferably from 1 second to 20 seconds, and more preferably from 2 seconds to 15 seconds.

For example, the heater 207 heats the process chamber 201 such that the temperature of the wafer 200 reaches a predetermined temperature ranging from 400° C. to 600° C., preferably from 400° C. to 550° C., and more preferably from 450° C. to 550° C. By setting the predetermined temperature to 600° C. or less, it is possible to appropriately obtain the film forming rate while suppressing the excessive thermal decomposition of the TMA gas, and it is possible to prevent impurities from entering the film and increasing the resistivity of the film. Since the thermal decomposition of TMA gas starts at about 450° C. under the conditions close to those of the substrate processing, the embodiments described herein would be more effective when applied to the process chamber 201 heated to a temperature of 550° C. or less. On the other hand, by setting the predetermined temperature to 400° C. or more, it is possible to form the film with a high efficiency and a high reactivity.

By supplying the TMA gas into the process chamber 201 according to the above-described processing conditions, an aluminum-containing layer is formed on a top surface (outermost surface) of the wafer 200. The aluminum-containing layer may contain carbon (C) and hydrogen (H) in addition to aluminum (Al). The aluminum-containing layer may be formed by the physical adsorption of the TMA on the top surface of the wafer 200, by the chemical adsorption of substances generated by decomposing a part of the TMA on the top surface of the wafer 200, or by the deposition of aluminum generated by the thermal decomposition of the TMA on the top surface of the wafer 200. That is, the aluminum-containing layer may be an adsorption layer (a physical adsorption layer or a chemical adsorption layer) of the TMA or substances generated by decomposing a part of the TMA, or may be an aluminum deposition layer (an aluminum layer).

First Residual Gas Removing Step S112

After the aluminum-containing layer is formed, the valve 314 is closed to stop the supply of the TMA gas. In the first residual gas removing step S112, with the APC valve 243 open, the vacuum pump 246 vacuum-exhausts the inner atmosphere of the process chamber 201 to remove a residual TMA gas in the process chamber 201 which did not react or which contributed to the formation of the aluminum-containing layer from the process chamber 201. In the first residual gas removing step S112, with the valves 514 and 524 open, the $N_2$ gas is continuously supplied into the process chamber 201. The $N_2$ gas serves as a purge gas, which improves the efficiency of removing the residual TMA gas which did not react or which contributed to the formation of the aluminum-containing layer from the process chamber 201. In the first residual gas removing step S112, the $N_2$ gas through the valves 514 and 524 may be continuously supplied or may be intermittently (that is, in a pulse-wise manner) supplied.

Reactive Gas Supply Step S113

After the residual gas such as the residual TMA gas is removed from the process chamber 201, the valve 324 is opened to supply the $O_3$ gas) serving as the reactive gas into the gas supply pipe 320. After a flow rate of the $O_3$ gas) is adjusted by the MFC 322, the $O_3$ gas) whose flow rate is adjusted is supplied onto the plurality of the wafers including the wafer 200 accommodated in the process chamber 201 through the plurality of the gas supply holes 420a of the nozzle 420. That is, the wafer 200 is exposed to the $O_3$ gas).

The $O_3$ gas) supplied through the plurality of the gas supply holes 420a passes through the inside of the process chamber 201, and is exhausted through the exhaust pipe 231. In the reactive gas supply step S113, the valve 524 may be opened to supply the $N_2$ gas serving into the gas supply pipe 520. After a flow rate of the $N_2$ gas is adjusted by the MFC 522, the $N_2$ gas whose flow rate is adjusted is supplied into the process chamber 201 with the $O_3$ gas), and is exhausted through the exhaust pipe 231. In the reactive gas supply step S113, in order to prevent the $O_3$ gas) from entering the nozzle 410 (that is, in order to prevent a back flow of the $O_3$ gas)), the valve 514 may be opened to supply the $N_2$ gas into the gas supply pipe 510. The $N_2$ gas supplied into the gas supply pipe 510 is then supplied into the process chamber 201 through the nozzle 410 (that is, the process chamber 201 is purged), and is exhausted through the exhaust pipe 231.

In the reactive gas supply step S113, the APC valve 243 is appropriately adjusted (controlled) to adjust the inner pressure of the process chamber 201 to a predetermined pressure. For example, the predetermined pressure of the process chamber 201 in the reactive gas supply step S113 may range from 1 Pa to 1,000 Pa, preferably from 1 Pa to 100 Pa, and more preferably from 10 Pa to 40 Pa. In the reactive gas supply step S113, for example, a supply flow rate of the $O_3$ may be set to a predetermined flow rate ranging from 5 slm to 40 slm, preferably from 5 slm to 30 slm, and more preferably from 10 slm to 20 slm. For example, a time duration (also referred to as a "supply time") of supplying the $O_3$ gas) to the wafer 200 may be set to a predetermined time ranging from 1 second to 60 seconds, preferably from 1 second to 30 seconds, and more preferably from 5 seconds to 25 seconds. The other process conditions of the reactive gas supply step S113 are the same as those of the above-described source gas supply step S111.

In the reactive gas supply step S113, the $O_3$ gas) and the inert gas (that is, the $N_2$ gas) are supplied into the process chamber 201 without any other gas being supplied into the process chamber 201 together with the $O_3$ gas) and the inert gas. The $O_3$ gas) supplied into the process chamber 201 reacts with at least a part of the aluminum-containing layer formed on the wafer 200 in the source gas supply step S111. Then, the aluminum-containing layer is oxidized to form an aluminum oxide layer (also referred to as an "AlO layer") containing aluminum (Al) and oxygen (O) serving as a metal oxide layer. That is, the aluminum-containing layer is modified into the aluminum oxide layer.

Second Residual Gas Removing Step S114

After the aluminum oxide layer (AlO layer) is formed, the valve 324 is closed to stop the supply of the $O_3$ gas). In the second residual gas removing step S114, with the APC valve 243 open, the vacuum pump 246 vacuum-exhausts the inner atmosphere of the process chamber 201 to remove a residual $O_3$ gas) in the process chamber 201 which did not react or which contributed to the formation of the AlO layer or the reaction by-products from the process chamber 201 in the same manner as in the first residual gas removing step S112. In the second residual gas removing step S114, with the valves 514 and 524 open, the $N_2$ gas is continuously supplied into the process chamber 201 (that is, the process chamber 201 is purged).

Performing Predetermined Number of Times, Step S115

By performing a cycle wherein the source gas supply step S111, the first residual gas removing step S112, the reactive gas supply step S113 and the second residual gas removing step S114 are sequentially performed in order a predetermined number of times (one or more times), the AlO film is formed on the wafer 200. The predetermined number of times of the cycle is appropriately selected according to a target thickness of the AlO film. However, it is preferable that the cycle is performed a plurality of times. For example, the target thickness of the AlO film may range from 0.1 nm to 150 nm, preferably from 0.1 nm to 10 nm. By setting the target thickness of the AlO film to 150 nm or less, it is possible to reduce a surface roughness of the AlO film. By setting the target thickness of the AlO film to 0.1 nm or more, it is possible to suppress the AlO film from being peeled off due to a stress difference between the AlO film and its underlying film.

After-Purge Step S121 and Returning to Atmospheric Pressure Step S122

After the film-forming step S110 is completed, the valves 514 and 524 are opened. The $N_2$ gas is supplied into the process chamber 201 through each of the gas supply pipes 310 and 320, and then the $N_2$ gas supplied into the process chamber 201 is exhausted through the exhaust pipe 231. The $N_2$ gas serves as the purge gas, and the inner atmosphere of the process chamber 201 is purged with the $N_2$ gas. Thus the gas remaining in the process chamber 201 or the reaction by-products remaining in the process chamber 201 are removed from the process chamber 201 (after-purge step S121). Thereafter, the inner atmosphere of the process chamber 201 is replaced with the $N_2$ gas (substitution by inert gas), and the inner pressure of the process chamber 201 is returned to the normal pressure (atmospheric pressure) (returning to atmospheric pressure step S122).

Boat Unloading Step S123 and Wafer Discharging Step S124

Thereafter, the seal cap 219 is lowered by the boat elevator 115 and the lower end opening of the manifold 209 is opened. The boat 217 with the plurality of processed wafers including the wafer 200 charged therein is unloaded out of the reaction tube 203 through the lower end opening of the manifold 209 (boat unloading step S123). After the boat 217 is unloaded, the shutter (not shown) is moved. The lower end opening of the manifold 209 is sealed by the shutter (not shown) through the O-ring (not shown) (shutter closing step). Then, the plurality of the processed wafers including the wafer 200 are discharged (transferred) from the boat 217 (wafer discharging step S124).

Figure 8B:
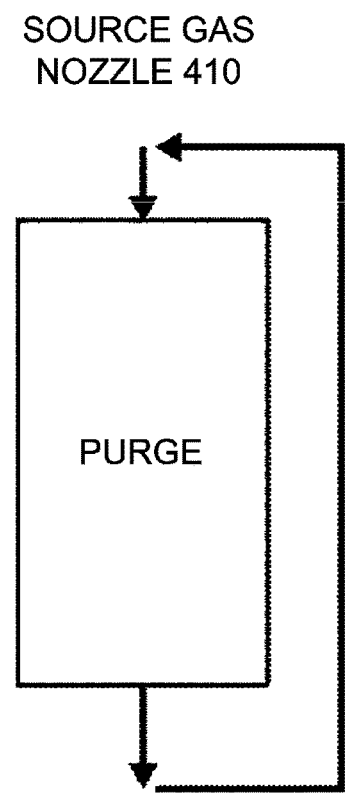

As shown in FIG. 8B, by opening the valve 514 and supplying the inert gas (that is, the $N_2$ gas) into the nozzle 410 (see FIG. 8B) to promote the heat dissipation from the inner wall of the nozzle 410 at a time, such as an idling time, other than the film-forming step S110 (that is, the steps S111 through S114) is performed, it is possible to effectively lower a temperature of the TMA gas serving as the source gas supplied into the nozzle 410 in the subsequent film-forming step S110.

Modified Example of First Embodiment

Subsequently, a modified example of the first embodiment according to the technique described herein will be described. The difference between the first embodiment and the modified example of the first embodiment is that the $O_3$ gas) is used as the reactive gas supplied into the process chamber 201 through the gas supply pipe 320 and the nozzle 420 according to the first embodiment, and $NH_3$ gas serving as a nitrogen-containing gas (which is a nitriding gas or a nitriding agent) is used as the reactive gas according to the modified example of the first embodiment. The other processing conditions and the steps of the substrate processing of the modified example of the first embodiment are substantially the same as those of the first embodiment described above. According to the modified example of the first embodiment, by alternately supplying the TMA gas and the $NH_3$ gas into the process chamber 201, an aluminum nitride film (also referred to as an "AlN film") is formed on the wafer 200.

Second Embodiment

Subsequently, a preferred second embodiment according to the technique described herein will be described. A configuration of the substrate processing apparatus 10 preferably used in the second embodiment is the same as that of the substrate processing apparatus 10 preferably used in the first embodiment described above. According to the first embodiment, the TMA gas is used as the source gas supplied into the process chamber 201 through the gas supply pipe 310 and the nozzle 410. However, according to the second embodiment, the TEMAH gas is used as the source gas as an example of the organic compound containing hafnium (Hf). Similar to the first embodiment, the $O_3$ gas) is used as the reactive gas supplied into the process chamber 201 through the gas supply pipe 320 and the nozzle 420. According to the second embodiment, by alternately supplying the TEMAH gas and the $O_3$ gas) into the process chamber 201, the HfO film is formed on the wafer 200. A sequence of the substrate processing of forming the HfO film is similar to the sequence of the substrate processing of forming the AlO film of the first embodiment.

Modified Example of Second Embodiment

Subsequently, a modified example of the second embodiment according to the technique described herein will be described. The difference between the second embodiment and the modified example of the second embodiment is that the $O_3$ gas) is used as the reactive gas supplied into the process chamber 201 through the gas supply pipe 320 and the nozzle 420 according to the second embodiment, and the $NH_3$ gas serving as the nitrogen-containing gas (which is a nitriding gas or a nitriding agent) is used as the reactive gas according to the modified example of the second embodiment. The other processing conditions and the steps of the substrate processing of the modified example of the second embodiment are substantially the same as those of the second embodiment described above. According to the modified example of the second embodiment, by alternately supplying the TEMAH gas and the $NH_3$ gas into the process chamber 201, a hafnium nitride film (also referred to as an "HfN film") is formed on the wafer 200.

Third Embodiment

Subsequently, a preferred third embodiment according to the technique described herein will be described. A configuration of the substrate processing apparatus 10 preferably used in the third embodiment is the same as that of the substrate processing apparatus 10 preferably used in the first embodiment described above. According to the first embodiment, the TMA gas is used as the source gas supplied into the process chamber 201 through the gas supply pipe 310 and the nozzle 410. However, according to the third embodiment, the TEMAZ gas is used as the source gas as an example of the organic compound containing zirconium (Zr). Similar to the first embodiment, the $O_3$ gas) is used as the reactive gas supplied into the process chamber 201 through the gas supply pipe 320 and the nozzle 420. According to the third embodiment, by alternately supplying the TEMAZ gas and the $O_3$ gas) into the process chamber 201, the ZrO film is formed on the wafer 200. A sequence of the substrate processing of forming the ZrO film is similar to the sequence of the substrate processing of forming the AlO film of the first embodiment.

Modified Example of Third Embodiment

Subsequently, a modified example of the third embodiment according to the technique described herein will be described. The difference between the third embodiment and the modified example of the third embodiment is that the $O_3$ gas) is used as the reactive gas supplied into the process chamber 201 through the gas supply pipe 320 and the nozzle 420 according to the third embodiment, and the $NH_3$ gas serving as the nitrogen-containing gas (which is a nitriding gas or a nitriding agent) is used as the reactive gas according to the modified example of the third embodiment. The other processing conditions and the steps of the substrate processing of the modified example of the third embodiment are substantially the same as those of the third embodiment described above. According to the modified example of the third embodiment, by alternately supplying the TEMAZ gas and the $NH_3$ gas into the process chamber 201, a zirconium nitride film (also referred to as a "ZrN film") is formed on the wafer 200.

Fourth Embodiment

Subsequently, a preferred fourth embodiment according to the technique described herein will be described. A configuration of the substrate processing apparatus 10 preferably used in the fourth embodiment is the same as that of the substrate processing apparatus 10 preferably used in the first embodiment described above. According to the first embodiment, the TMA gas is used as the source gas supplied into the process chamber 201 through the gas supply pipe 310 and the nozzle 410. However, according to the fourth embodiment, TDMAT (tetrakis dimethylamino titanium, $Ti[N(CH_3)_2]_4$) gas is used as the source gas as an example of the organic compound containing titanium (Ti). Similar to the first embodiment, the $O_3$ gas) is used as the reactive gas supplied into the process chamber 201 through the gas supply pipe 320 and the nozzle 420. According to the fourth embodiment, by alternately supplying the TDMAT gas and the $O_3$ gas) into the process chamber 201, a titanium oxide file (also referred to as a "TiO film") is formed on the wafer 200. A sequence of the substrate processing of forming the TiO film is similar to the sequence of the substrate processing of forming the AlO film of the first embodiment.

Modified Example of Fourth Embodiment

Subsequently, a modified example of the fourth embodiment according to the technique described herein will be described. The difference between the fourth embodiment and the modified example of the fourth embodiment is that the $O_3$ gas) is used as the reactive gas supplied into the process chamber 201 through the gas supply pipe 320 and the nozzle 420 according to the fourth embodiment, and the $NH_3$ gas serving as the nitrogen-containing gas (which is a nitriding gas or a nitriding agent) is used as the reactive gas according to the modified example of the fourth embodiment. The other processing conditions and the steps of the substrate processing of the modified example of the fourth embodiment are substantially the same as those of the fourth embodiment described above. According to the modified example of the fourth embodiment, by alternately supplying the TDMAT gas and the $NH_3$ gas into the process chamber 201, a titanium nitride film (also referred to as a "TiN film") is formed on the wafer 200.

Fifth Embodiment

Subsequently, a preferred fifth embodiment according to the technique described herein will be described. A configuration of the substrate processing apparatus 10 preferably used in the fifth embodiment is the same as that of the substrate processing apparatus 10 preferably used in the first embodiment described above. According to the first embodiment, the TMA gas is used as the source gas supplied into the process chamber 201 through the gas supply pipe 310 and the nozzle 410. However, according to the fifth embodiment, 3DMAS (tris dimethylamino silane, $SiH(N(CH_3)_2)_3$) gas is used as the source gas as an example of the organic compound containing silicon (Si). Similar to the first embodiment, the $O_3$ gas) is used as the reactive gas supplied into the process chamber 201 through the gas supply pipe 320 and the nozzle 420. According to the fifth embodiment, by alternately supplying the 3DMAS gas and the $O_3$ gas) into the process chamber 201, a silicon oxide file (also referred to as a "SiO film") is formed on the wafer 200. A sequence of the substrate processing of forming the SiO film is similar to the sequence of the substrate processing of forming the AlO film of the first embodiment.

Modified Example of Fifth Embodiment

Subsequently, a modified example of the fifth embodiment according to the technique described herein will be described. The difference between the fifth embodiment and the modified example of the fifth embodiment is that the $O_3$ gas) is used as the reactive gas supplied into the process chamber 201 through the gas supply pipe 320 and the nozzle 420 according to the fifth embodiment, and the $NH_3$ gas serving as the nitrogen-containing gas (which is a nitriding gas or a nitriding agent) is used as the reactive gas according to the modified example of the fifth embodiment. The other processing conditions and the steps of the substrate processing of the modified example of the fifth embodiment are substantially the same as those of the fifth embodiment described above. According to the modified example of the fifth embodiment, by alternately supplying the 3DMAS gas and the $NH_3$ gas into the process chamber 201, a silicon nitride film (also referred to as a "SiN film") is formed on the wafer 200.

Sixth Embodiment

Subsequently, a preferred sixth embodiment according to the technique described herein will be described. A configuration of the substrate processing apparatus 10 preferably used in the sixth embodiment is the same as that of the substrate processing apparatus 10 preferably used in the first embodiment described above. According to the first embodiment, the TMA gas is used as the source gas supplied into the process chamber 201 through the gas supply pipe 310 and the nozzle 410. However, according to the sixth embodiment, HCDS (hexachlorodisilane, $Si_2Cl_6$) gas is used as the source gas as an example of the organic compound containing silicon (Si). According to the first embodiment, the $O_3$ gas) is used as the reactive gas supplied into the process chamber 201 through the gas supply pipe 320 and the nozzle 420. However, according to the sixth embodiment, oxygen ($O_2$) gas and hydrogen ($H_2$) gas are used as the reactive gas serving as an oxidizing gas (which is an oxidizing agent). According to the sixth embodiment, by alternately supplying the HCDS gas and the oxidizing gas (that is, the $O_2$ gas and the $H_2$ gas) into the process chamber 201, a SiO film is formed on the wafer 200. A sequence of the substrate processing of forming the SiO film is similar to the sequence of the substrate processing of forming the AlO film of the first embodiment.

Modified Example of Sixth Embodiment

Subsequently, a modified example of the sixth embodiment according to the technique described herein will be described. The difference between the sixth embodiment and the modified example of the sixth embodiment is that the $O_2$ gas and the $H_2$ gas are used as the reactive gas supplied into the process chamber 201 through the gas supply pipe 320 and the nozzle 420 according to the sixth embodiment, and the $NH_3$ gas serving as the nitrogen-containing gas (which is a nitriding gas or a nitriding agent) is used as the reactive gas according to the modified example of the sixth embodiment. The other processing conditions and the steps of the substrate processing of the modified example of the sixth embodiment are substantially the same as those of the sixth embodiment described above. According to the modified example of the sixth embodiment, by alternately supplying the HCDS gas and the $NH_3$ gas into the process chamber 201, a SiN film is formed on the wafer 200.

Seventh Embodiment

Subsequently, a preferred seventh embodiment according to the technique described herein will be described. A configuration of the substrate processing apparatus 10 preferably used in the seventh embodiment is the same as that of the substrate processing apparatus 10 preferably used in the first embodiment described above. According to the first embodiment, the TMA gas is used as the source gas supplied into the process chamber 201 through the gas supply pipe 310 and the nozzle 410. However, according to the seventh embodiment, tungsten hexafluoride ($WF_6$) gas is used as the source gas as an example of the organic compound containing tungsten (W). According to the first embodiment, the $O_3$ gas) is used as the reactive gas supplied into the process chamber 201 through the gas supply pipe 320 and the nozzle 420. However, according to the seventh embodiment, diborane ($B_2H_6$) gas is used as the reactive gas. According to the seventh embodiment, by alternately supplying the $WF_6$ gas and the $B_2H_6$ gas into the process chamber 201, a tungsten film (also referred to as a "W film") is formed on the wafer 200. A sequence of the substrate processing of forming the W film is similar to the sequence of the substrate processing of forming the AlO film of the first embodiment.

First Modified Example of Seventh Embodiment

Subsequently, a first modified example of the seventh embodiment according to the technique described herein will be described. The difference between the seventh embodiment and the first modified example of the seventh embodiment is that the $B_2H_6$ gas is used as the reactive gas supplied into the process chamber 201 through the gas supply pipe 320 and the nozzle 420 according to the seventh embodiment, and the $O_3$ gas) and the $B_2H_6$ gas are used as the reactive gas according to the first modified example of the seventh embodiment. The other processing conditions and the steps of the substrate processing of the first modified example of the seventh embodiment are substantially the same as those of the seventh embodiment described above. However, the $O_3$ gas) may be supplied into the process chamber 201 through a gas supply pipe and a nozzle different from the gas supply pipes and the nozzles described above, respectively. According to the first modified example of the seventh embodiment, by alternately supplying the $WF_6$ gas and the reactive gas (that is, the $B_2H_6$ gas and the $O_3$ gas)) into the process chamber 201 without mixing them with one another, a tungsten film (W film) is formed on the wafer 200.

Second Modified Example of Seventh Embodiment

Subsequently, a second modified example of the seventh embodiment according to the technique described herein will be described. The difference between the first modified example of the seventh embodiment and the second modified example of the seventh embodiment is that the $B_2H_6$ gas and the $O_3$ gas) are used as the reactive gas supplied into the process chamber 201 through the gas supply pipe 320 and the nozzle 420 according to the first modified example of the seventh embodiment, and the $B_2H_6$ gas and the $NH_3$ gas are used as the reactive gas according to the second modified example of the seventh embodiment. The other processing conditions and the steps of the substrate processing of the second modified example of the seventh embodiment are substantially the same as those of the first modified example of the seventh embodiment described above. According to the second modified example of the seventh embodiment, by alternately supplying the $WF_6$ gas and the reactive gas (that is, the $B_2H_6$ gas and the $NH_3$ gas) into the process chamber 201 without mixing them with one another, a tungsten film (W film) is formed on the wafer 200.

According to the second to seventh embodiments described above, similar to the first embodiment, the reaction tube 203 constituting the process chamber 201 is made of the transparent quartz whose reflectance with respect to the infrared ray is low, and the nozzle 410 is made of the opaque quartz. The opaque quartz whose reflectance with respect to the infrared ray is high and constituting the nozzle 410 contains bubbles therein. Therefore, the inner surface of the nozzle 410 is of a minute concave-convex shape due to the bubbles. Thus, the gas flow in the nozzle 410 becomes a turbulent flow. As a result, the temperature of the gas flowing inside the nozzle 410 is lower than the pre-set inner temperature of the furnace or the temperature of the wafer 200. Therefore, when the temperature of the wafer 200 is elevated to form the film on the wafer 200, the impurities (that is, the organic substances in the organic compound) s are organic substances) hardly enter the film and the foreign matters are hardly generated in the nozzle 410.

As described above, the substrate processing apparatus 10 used in the first to seventh embodiments may be applied when forming an oxide film, a nitride film and a metal film, and may be applied regardless of the type of the film to be formed. In particular, the substrate processing apparatus 10 used in the first to seventh embodiments may be effectively applied when a process of forming the film is performed at a temperature higher than a self-decomposition temperature of the gas such as the source gas.

The substrate processing apparatus 10 used in the first to seventh embodiments may be applied regardless of the type of the gas supplied into the nozzle 410 configured to supply the source gas and made of the second material whose reflectance with respect to the infrared ray is higher than that of the first material constituting the reaction tube 203. In particular, the substrate processing apparatus 10 used in the first to seventh embodiments may be effectively applied when the process of forming the film is performed at the temperature higher than the self-decomposition temperature of the gas such as the source gas. For example, instead of the gas species used in the first to seventh embodiments, the substrate processing apparatus 10 used in the first to seventh embodiments may be effectively applied when a compound such DCS (dichlorosilane, $SiH_2Cl_2$), BTBAS (bis tertiary butyl amino silane, $SiH_2[NH(C_4H_9)]_2$), monosilane ($SiH_4$) and titanium chloride ($TiCl_4$) is used as the gas such as the source gas. Among the compounds described above, an organic source compound is particularly effective since the thermal decomposition temperature thereof is low.

The substrate processing apparatus 10 used in the first to seventh embodiments may be applied regardless of the type of the gas supplied into the nozzle 420 configured to supply the reactive gas and made of the third material whose reflectance with respect to the infrared ray is lower than that of the first material and that of the second material or made of the fourth material whose absorptance with respect to the infrared ray is higher than that of the first material and that of the second material. In particular, the substrate processing apparatus 10 used in the first to seventh embodiments may be effectively applied when the process of forming the film is performed at the temperature higher than the self-decomposition temperature of the reactive gas which is difficult to be deactivated. For example, in addition to the gas species used in the first to seventh embodiments, the substrate processing apparatus 10 used in the first to seventh embodiments may be effectively applied when a gas such as the $O_2$ gas, a mixed gas of the $O_2$ gas and the $H_2$ gas, a nitrous oxide ($N_2O$) gas, water vapor ($H_2O$) and the $NH_3$ gas is used as the reactive gas.

When the substrate processing apparatus 10 used in the first to seventh embodiments is applied to perform the process of forming the film at a temperature lower than the self-decomposition temperature of the gas such as the source gas, the nozzle 410 configured to supply the source gas may be made of the third material whose reflectance with respect to the infrared ray is lower than that of the first material and that of the second material, or may be made of the fourth material whose absorptance with respect to the infrared ray is higher than that of the first material and that of the second material. When the nozzle 410 is made of the third material or the fourth material, the source gas may be selected regardless of the type of the gas as long as the source gas can be used in the process of forming the film at the temperature lower than the self-decomposition temperature of the source gas. For example, in addition to the gas species used in the first to seventh embodiments, the substrate processing apparatus 10 used in the first to seventh embodiments may be effectively applied when the compound such as the DCS, the BTBAS, the $SiH_4$ and the $TiCl_4$ is used as the source gas.

The above-described first to seventh embodiments may be appropriately combined form a composite film of the films formed in the respective embodiments. For example, by combining the first embodiment and the fifth embodiment, it is possible to form a titanium aluminum oxide film (TiAlO film) using a plurality of organic compounds (that is, the compounds exemplified in the first embodiment and the fifth embodiment). For example, by combining the sixth embodiment and the modified example of the sixth embodiment, it is possible to form a silicon oxynitride film (SiON film) using a plurality of reactive gases (that is, the oxygen-containing gas and the nitrogen-containing gas).

The source gas nozzle in the present specification is preferably used in a path whose pressure is equal to or higher than a pressure on the wafer 200 when the gas such as the source gas is supplied. For example, the substrate processing apparatus 10 used in the first to seventh embodiments may not be limited to a batch type substrate processing apparatus or a single-wafer type substrate processing apparatus.

While the technique is described in detail by way of the embodiments and the modified examples thereof, the technique described herein is not limited thereto. Therefore, the scope of the technique described herein should be construed as defined in the following claims.

As described above, the entire contents of Japanese Patent Application No. 2018-063255 are hereby incorporated in the present specification by reference.

All documents, patent applications, and technical standards described herein are hereby incorporated in the present specification by reference to the same extent that the contents of each of the documents, the patent applications and the technical standards are specifically described.

According to some embodiments in the present disclosure, it is possible to suppress or prevent the inside of the source gas nozzle from being heated to the substrate processing temperature.

What is claimed is:

1. A substrate processing apparatus comprising:
a reaction tube constituted by a first material and capable of accommodating a substrate;
a substrate retainer configured to be capable of supporting a plurality of substrates comprising the substrate vertically in a horizontal orientation in a multistage manner; and
a source gas nozzle provided in the reaction tube, wherein at least a part of the source gas nozzle is constituted by a second material whose reflectance is higher than that of the first material and whose surface is rougher with bubbles contained therein than that of the first material, and a source gas is supplied through the source gas nozzle,
wherein the source gas nozzle extends at least from a lower end to an upper end of a substrate region in which the plurality of the substrates are arranged, a downstream portion of the source gas nozzle including a downstream end of the source gas nozzle comprises the second material, an upstream portion of the source gas nozzle located more upstream than the downstream portion of the source gas nozzle comprises the first material, and the first material and the second material are provided with a plurality of supply holes configured to supply the source gas into the reaction tube throughout a range from an upper portion of the reaction tube to a lower portion of the reaction tube.

2. The substrate processing apparatus of claim 1, wherein the reflectance of the second material is 75% or more.

3. The substrate processing apparatus of claim 1, wherein the reflectance of the second material for infrared ray is higher than that of the first material.

4. The substrate processing apparatus of claim 1, further comprising:
a heater configured to heat the reaction tube using infrared ray.

5. The substrate processing apparatus of claim 4, wherein the heater is provided to heat a range extending at least from the lower end to the upper end of the substrate region in which the plurality of the substrates are arranged.

6. The substrate processing apparatus of claim 1, wherein at least a portion of the source gas nozzle downstream of a middle of the substrate region is made of the second material.

7. The substrate processing apparatus of claim 1, further comprising:
a source gas supply system configured to supply the source gas through the source gas nozzle; and
a controller configured to control the source gas supply system,
wherein the source gas supply system comprises:
a tank configured to store the source gas;
a gas supply pipe connected to the tank; and
a valve provided at the gas supply pipe, and
wherein the controller is further configured to control the valve such that the source gas compressed in the tank is supplied into the source gas nozzle through the gas supply pipe.

8. The substrate processing apparatus of claim 1, further comprising:
a source gas supply system configured to supply the source gas through the source gas nozzle; and
a controller configured to control the source gas supply system,
wherein the source gas supply system comprises an inert gas supply system configured to supply an inert gas, and
the controller is further configured to control the inert gas supply system such that the inert gas is supplied to the source gas nozzle in a process other than a process of supplying the source gas through the source gas nozzle.

9. The substrate processing apparatus of claim 1, further comprising:
a source gas supply system configured to supply the source gas through the source gas nozzle;
a reactive gas supply system configured to supply a reactive gas whose molecular structure is different from that of the source gas into the reaction tube through a reactive gas nozzle; and
a controller configured to control the source gas supply system and the reactive gas supply system to form a film on the substrate by performing: (a) supplying the source gas into the reaction tube in which the substrate is accommodated through the source gas nozzle; and (b) supplying the reactive gas into the reaction tube through the reactive gas nozzle.

10. The substrate processing apparatus of claim 9, wherein the reactive gas nozzle is made of a third material whose reflectance is lower than that of the first material and whose surface is smoother than that of the first material.

11. The substrate processing apparatus of claim 9, wherein the reactive gas nozzle is made of a third material whose reflectance is lower than that of the second material and whose surface is smoother than that of the second material.

12. The substrate processing apparatus of claim 9, wherein the reactive gas nozzle is made of the first material.

13. The substrate processing apparatus of claim 1, wherein a part of the source gas nozzle extending from the downstream end of the source gas nozzle to a location within the substrate region comprises the second material, and the other part of the source gas nozzle extending from an upstream end of the source gas nozzle to the location within the substrate region comprises the first material.

14. The substrate processing apparatus of claim 13, wherein the location is at a middle portion of the substrate region.

15. A gas nozzle, provided in a reaction tube accommodating a plurality of substrates to be stacked vertically in a horizontal orientation in a multistage manner, at least a part of which is made of a second material whose reflectance is higher than that of a first material constituting the reaction tube and whose surface is rougher with bubbles contained therein than that of the first material, the gas nozzle configured to supply a source gas into the reaction tube, wherein the gas nozzle extends at least from a lower end to an upper end of a substrate region in which the plurality of the substrates are arranged, a downstream portion of the gas nozzle including a downstream end of the gas nozzle comprises the second material, an upstream portion of the gas nozzle located more upstream than the downstream portion of the source gas nozzle comprises the first material, and the first material and the second material are provided with a plurality of supply holes configured to supply the source gas into the reaction tube throughout a range from an upper portion of the reaction tube to a lower portion of the reaction tube.

16. A method of manufacturing a semiconductor device comprising:

(a) accommodating a substrate in a reaction tube constituted by a first material; and
(b) supplying a source gas into the reaction tube through a source gas nozzle extending at least from a lower end to an upper end of a substrate region in which a plurality of the substrates are arranged, wherein the source gas nozzle is provided in the reaction tube and a downstream portion of the source gas nozzle including a downstream end of the source gas nozzle comprises a second material whose reflectance is higher than that of the first material and whose surface is rougher with bubbles contained therein than that of the first material, an upstream portion of the source gas nozzle located more upstream than the downstream portion of the source gas nozzle comprises the first material, and the first material and the second material are provided with a plurality of supply holes configured to supply the source gas into the reaction tube throughout a range from an upper portion of the reaction tube to a lower portion of the reaction tube.

17. The method of claim 16, further comprising:
(c) supplying a reactive gas whose molecular structure is different from that of the source gas to the substrate.

* * * * *